(12) United States Patent
Okamoto et al.

(10) Patent No.: US 12,717,036 B2
(45) Date of Patent: Aug. 25, 2026

(54) LIGHT DETECTION DEVICE, LIGHT DETECTION SYSTEM, LIDAR DEVICE, MOBILE BODY, INSPECTION METHOD, AND METHOD FOR MANUFACTURING SEMICONDUCTOR DEVICE

(71) Applicant: KABUSHIKI KAISHA TOSHIBA, Tokyo (JP)

(72) Inventors: Kazuaki Okamoto, Yokohama Kanagawa (JP); Honam Kwon, Kawasaki Kanagawa (JP); Kazuhiro Suzuki, Meguro Tokyo (JP)

(73) Assignee: KABUSHIKI KAISHA TOSHIBA, Kawasaki Kanagawa (JP)

(*) Notice: Subject to any disclaimer, the term of this patent is extended or adjusted under 35 U.S.C. 154(b) by 1030 days.

(21) Appl. No.: 17/823,596

(22) Filed: Aug. 31, 2022

(65) Prior Publication Data

US 2023/0296776 A1 Sep. 21, 2023

(30) Foreign Application Priority Data

Mar. 16, 2022 (JP) ................................ 2022-041297

(51) Int. Cl.
*G01S 17/89* (2020.01)
*H01L 31/107* (2006.01)
(Continued)

(52) U.S. Cl.
CPC ............ *G01S 17/89* (2013.01); *H10F 30/225* (2025.01); *H10F 39/107* (2025.01); *H10F 77/206* (2025.01)

(58) Field of Classification Search
CPC ........ G01S 17/89; G01S 7/4816; G01S 7/497; G01S 17/42; G01S 17/931; H01L 31/107;
(Continued)

(56) References Cited

U.S. PATENT DOCUMENTS 4,965,515 A * 10/1990 Karasawa .......... G01R 31/2851 324/759.02
5,059,899 A * 10/1991 Farnworth ..... G01R 31/318511 438/18

(Continued)

FOREIGN PATENT DOCUMENTS

JP 2021-72347 A 5/2021
JP 2023-40744 A 3/2023

(Continued)

OTHER PUBLICATIONS

Japan Patent Office, Office Action in JP App. No. 2022-146309 (Jun. 3, 2025).

*Primary Examiner* — Isam A Alsomiri

(74) *Attorney, Agent, or Firm* — Finnegan, Henderson, Farabow, Garrett & Dunner, LLP

(57) ABSTRACT

According to one embodiment, a light detection device includes a first region, a second region, a first electrode, and a second electrode. The first region includes a plurality of first semiconductor light detection elements, and a plurality of first lenses respectively located on the plurality of first semiconductor light detection elements. The second region includes a plurality of second semiconductor light detection elements. No lens is located directly above the plurality of second semiconductor light detection elements. The first electrode is electrically connected with the plurality of first semiconductor light detection elements. The second electrode is electrically connected with the plurality of second semiconductor light detection elements.

18 Claims, 26 Drawing Sheets

(51) Int. Cl.
*H10F 30/225* (2025.01)
*H10F 39/10* (2025.01)
*H10F 77/20* (2025.01)

(58) Field of Classification Search
CPC ......... H01L 27/1446; H01L 31/022408; H10F 30/225; H10F 39/107; H10F 77/206; H10F 77/959
USPC ........................................................ 356/4.01
See application file for complete search history.

(56) References Cited

U.S. PATENT DOCUMENTS

| | | | | |
|---|---|---|---|---|
| 2005/0232477 | A1* | 10/2005 | Sugihara | G06T 7/001 382/149 |
| 2018/0035107 | A1* | 2/2018 | Yang | H04N 17/002 |
| 2020/0145600 | A1* | 5/2020 | Yamamoto | H10F 39/182 |
| 2021/0132230 | A1 | 5/2021 | Fujiwara et al. | |
| 2022/0268942 | A1* | 8/2022 | Kaizu | H04N 25/771 |

FOREIGN PATENT DOCUMENTS

| | | | |
|---|---|---|---|
| WO | WO 2019/012369 | A1 | 1/2019 |
| WO | WO 2021/010174 | A1 | 1/2021 |

* cited by examiner

LIGHT DETECTION DEVICE, LIGHT DETECTION SYSTEM, LIDAR DEVICE, MOBILE BODY, INSPECTION METHOD, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2022-041297, filed on Mar. 16, 2022; the entire contents of which are incorporated herein by reference.

FIELD

Embodiments described herein relate generally to a light detection device, a light detection system, a lidar device, a mobile body, an inspection method, and a method for manufacturing a semiconductor device.

BACKGROUND

There is a light detection device that detects light. Technology that can more easily inspect the light detection device is desirable.

DETAILED DESCRIPTION

Figure 1:
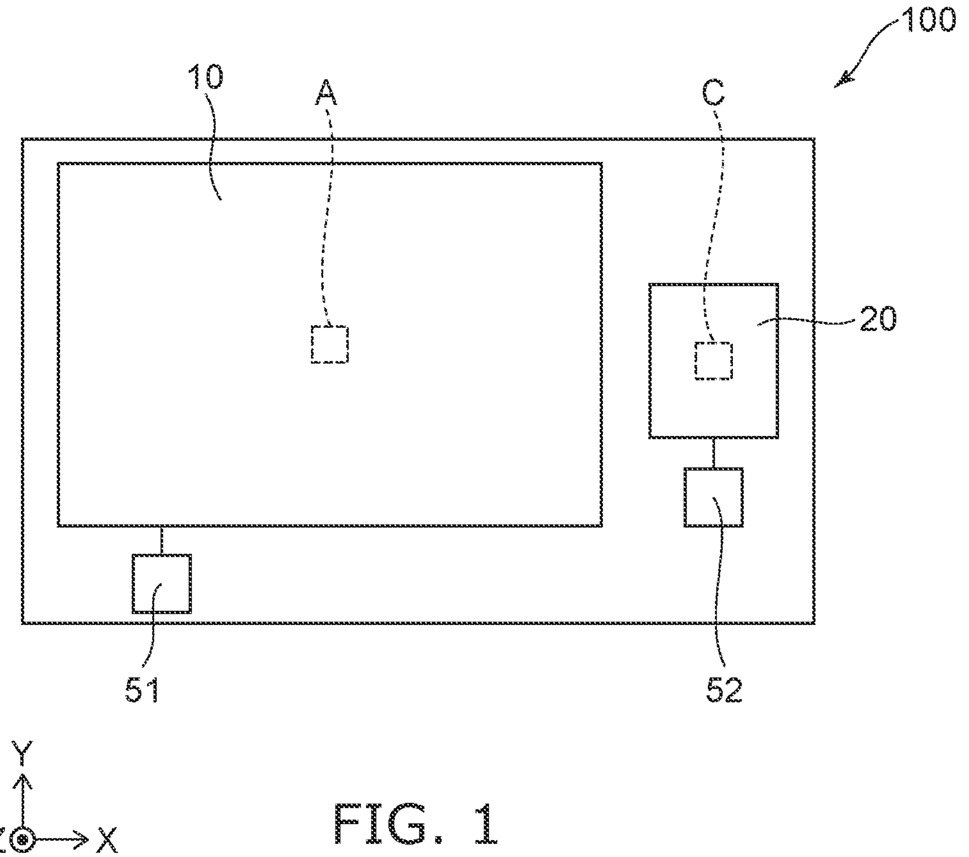
FIG. 1 is a schematic plan view showing a light detection device according to an embodiment.

According to one embodiment, a light detection device includes a first region, a second region, a first electrode, and a second electrode. The first region includes a plurality of first semiconductor light detection elements, and a plurality of first lenses respectively located on the plurality of first semiconductor light detection elements. The second region includes a plurality of second semiconductor light detection elements. No lens is located directly above the plurality of second semiconductor light detection elements. The first electrode is electrically connected with the plurality of first semiconductor light detection elements. The second electrode is electrically connected with the plurality of second semiconductor light detection elements.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

In the following description and drawings, the notations of $n^+$, $p^+$, p, and $p^-$ indicate relative levels of the impurity concentrations. Namely, a notation marked with "+" indicates that the impurity concentration is relatively greater than that of a notation not marked with either "+" or "−"; and a notation marked with "−" indicates that the impurity concentration is relatively less than that of an unmarked notation. When both a p-type impurity and an n-type impurity are included in each region, these notations indicate relative levels of the net impurity concentrations after the impurities compensate each other.

In the embodiments described below, each embodiment may be implemented by inverting the p-type and the n-type of the semiconductor regions.

First Embodiment

FIG. 1 is a schematic plan view showing a light detection device according to an embodiment.

As shown in FIG. 1, the light detection device 100 includes a first region 10, a second region 20, a pad electrode 51 (a first electrode), and a pad electrode 52 (a second electrode). The pad electrode 51 and the pad electrode 52 are positioned at the front side of the light detection device 100. The pad electrode 51 is provided to extract the output from the first region 10. The pad electrode 52 is provided to extract the output from the second region 20.

The pad electrode 52 is separated from the pad electrode 51 and electrically isolated from the pad electrode 51. Therefore, the output from the first region 10 and the output from the second region 20 can be independently extracted via the pad electrodes 51 and 52. The second region 20 may be separated from the first region 10 or may be adjacent to the first region 10.

Figure 2:
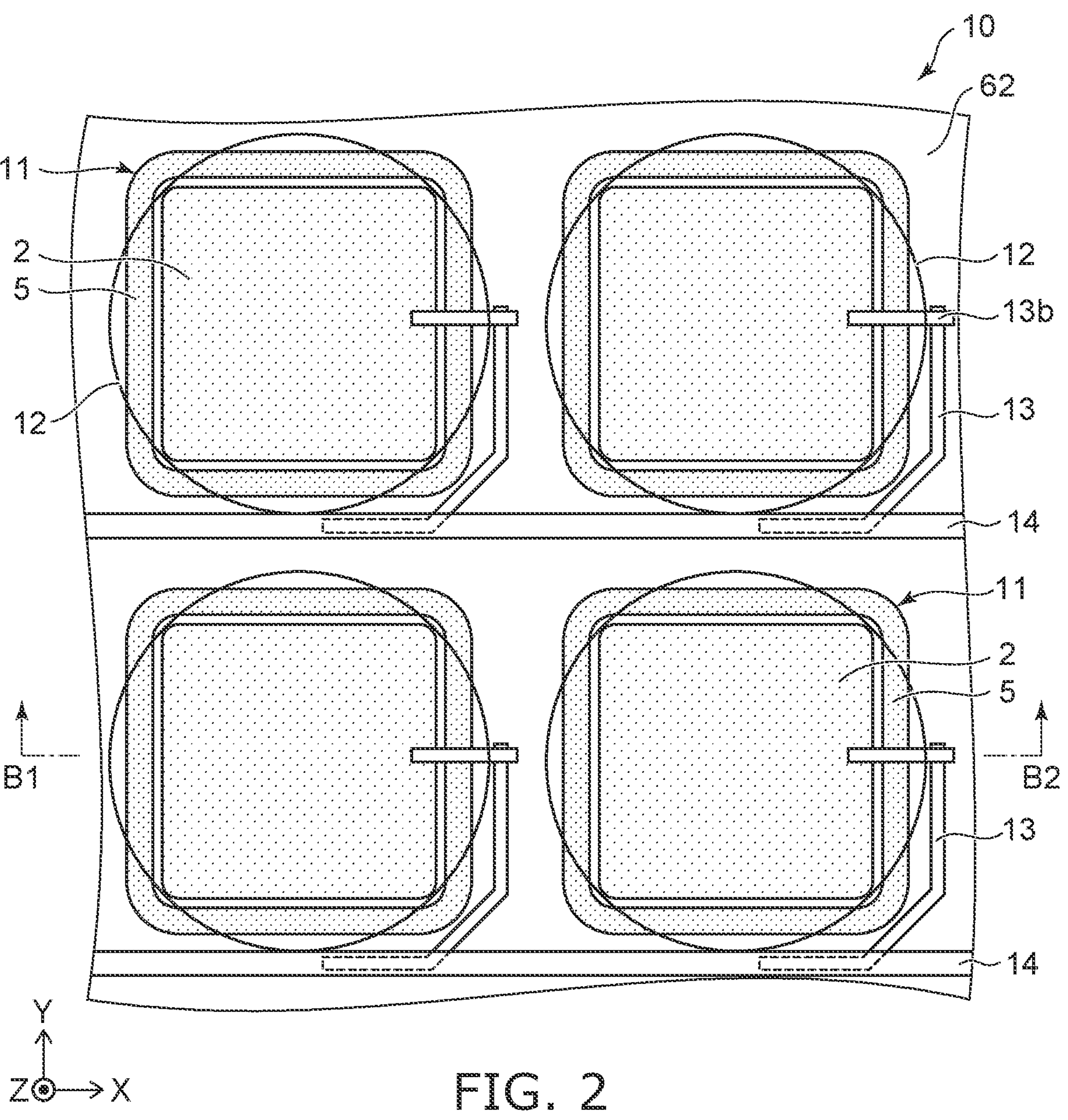
FIG. 2 is an enlarged plan view of portion A of FIG. 1.
Figure 3:
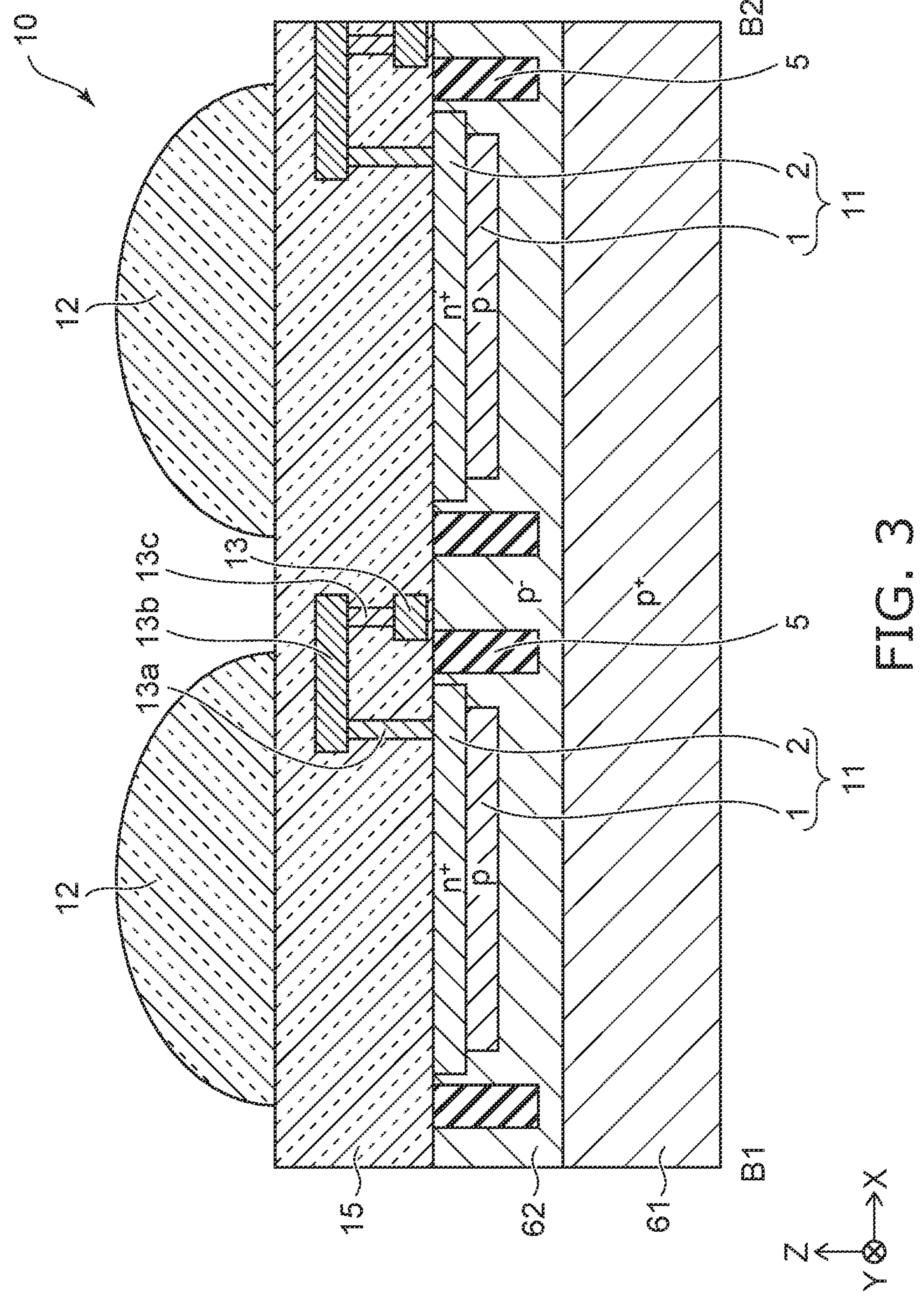
FIG. 3 is a B1-B2 cross-sectional view of FIG. 2.

FIG. 2 is an enlarged plan view of portion A of FIG. 1. FIG. 3 is a B1-B2 cross-sectional view of FIG. 2.

As shown in FIGS. 2 and 3, the first region 10 includes a first semiconductor light detection element 11, a first lens 12, a first quenching part 13, a first interconnect 14, and an insulating layer 15. The insulating layer 15 is not illustrated in FIG. 2.

In the description, the direction from the first semiconductor light detection element 11 toward the first lens 12 is taken as a Z-direction (a first direction). Two directions that cross each other and are perpendicular to the Z-direction are taken as an X-direction and a Y-direction. Also, the direction from the first semiconductor light detection element 11 toward the first lens 12 is called "up", and the opposite direction is called "down". These directions are based on the relative positional relationship between the first semiconductor light detection element 11 and the first lens 12 and are independent of the direction of gravity.

The first semiconductor light detection element 11 includes a p-type (first-conductivity-type) semiconductor region 1 (a first semiconductor region) and an $n^+$-type (second-conductivity-type) semiconductor region 2 (second semiconductor region). The $n^+$-type semiconductor region 2 is located on the p-type semiconductor region 1 and contacts the p-type semiconductor region 1. A p-n junction is formed between the p-type semiconductor region 1 and the $n^+$-type semiconductor region 2.

The insulating layer 15 is light-transmissive and is located on the first semiconductor light detection element 11. The first lens 12 is located on the insulating layer 15 and is positioned on the first semiconductor light detection element 11. The upper surface of the first lens 12 is convex upward. The lower surface of the first lens 12 is parallel to the X-Y plane. The first lens 12 concentrates light toward the corresponding first semiconductor light detection element 11.

The $n^+$-type semiconductor region 2 of the first semiconductor light detection element 11 is electrically connected with the first quenching part 13 via a contact plug 13*a*, an interconnect 13*b*, and a contact plug 13*c*. The first quenching part 13 is electrically connected with the first interconnect 14 via a not-illustrated contact plug. In other words, the first quenching part 13 is electrically connected between the first semiconductor light detection element 11 and the first interconnect 14.

Multiple first semiconductor light detection elements 11 are arranged in the X-direction and the Y-direction. The first quenching part 13 is electrically connected with at least one first semiconductor light detection element 11. Multiple first interconnects 14 are arranged in the Y-direction. Each first interconnect 14 is electrically connected with multiple first semiconductor light detection elements 11 arranged in the X-direction. The multiple first interconnects 14 are electrically connected with the pad electrode 51.

In the illustrated example, an insulating part 5 is located around the p-type semiconductor region 1 and the $n^+$-type semiconductor region 2 in the X-Y plane. For example, the multiple insulating parts 5 are separated from each other and are located respectively around the multiple first semiconductor light detection elements 11.

Figure 4:
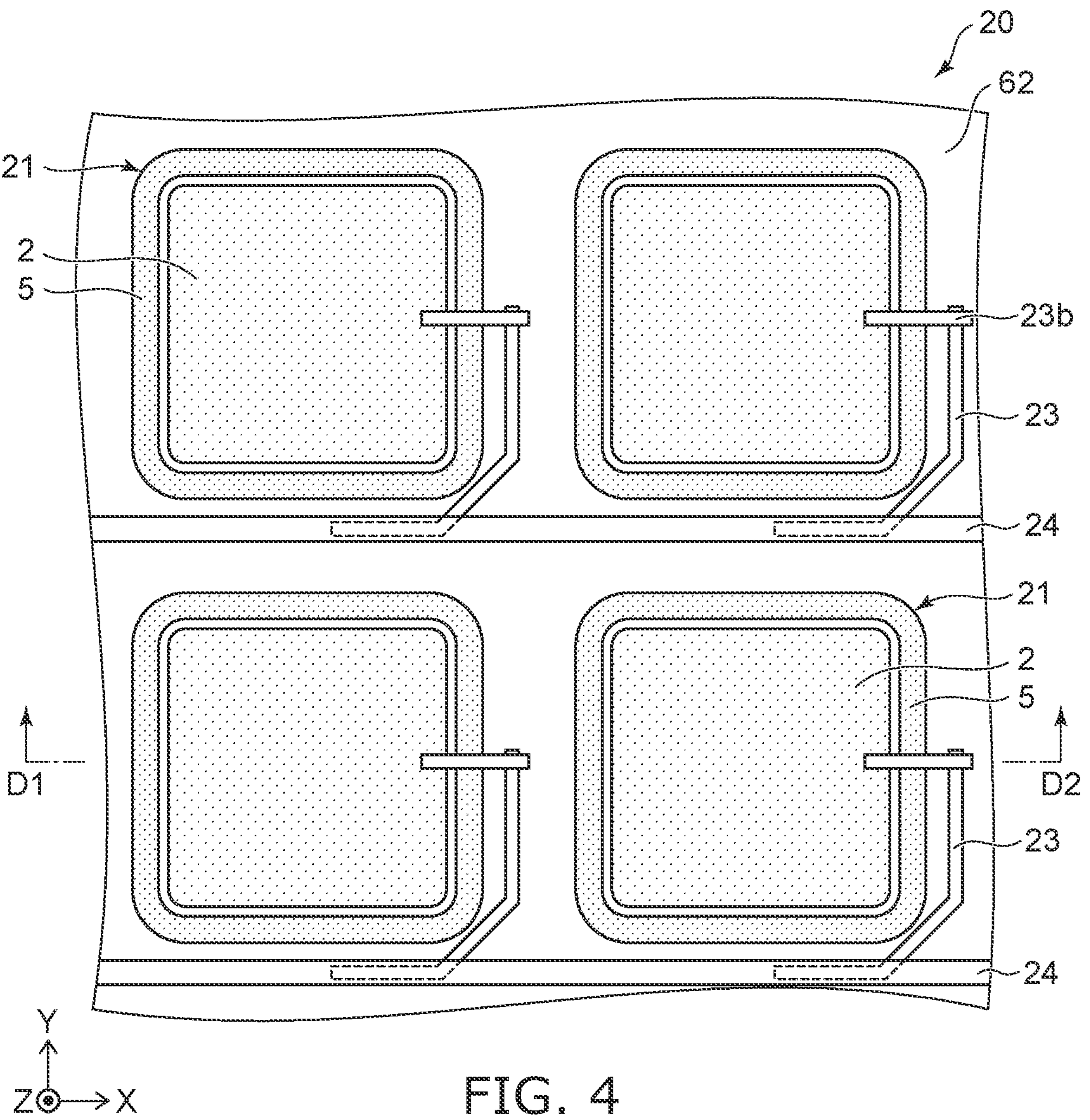
FIG. 4 is an enlarged plan view of portion C of FIG. 1.
Figure 5:
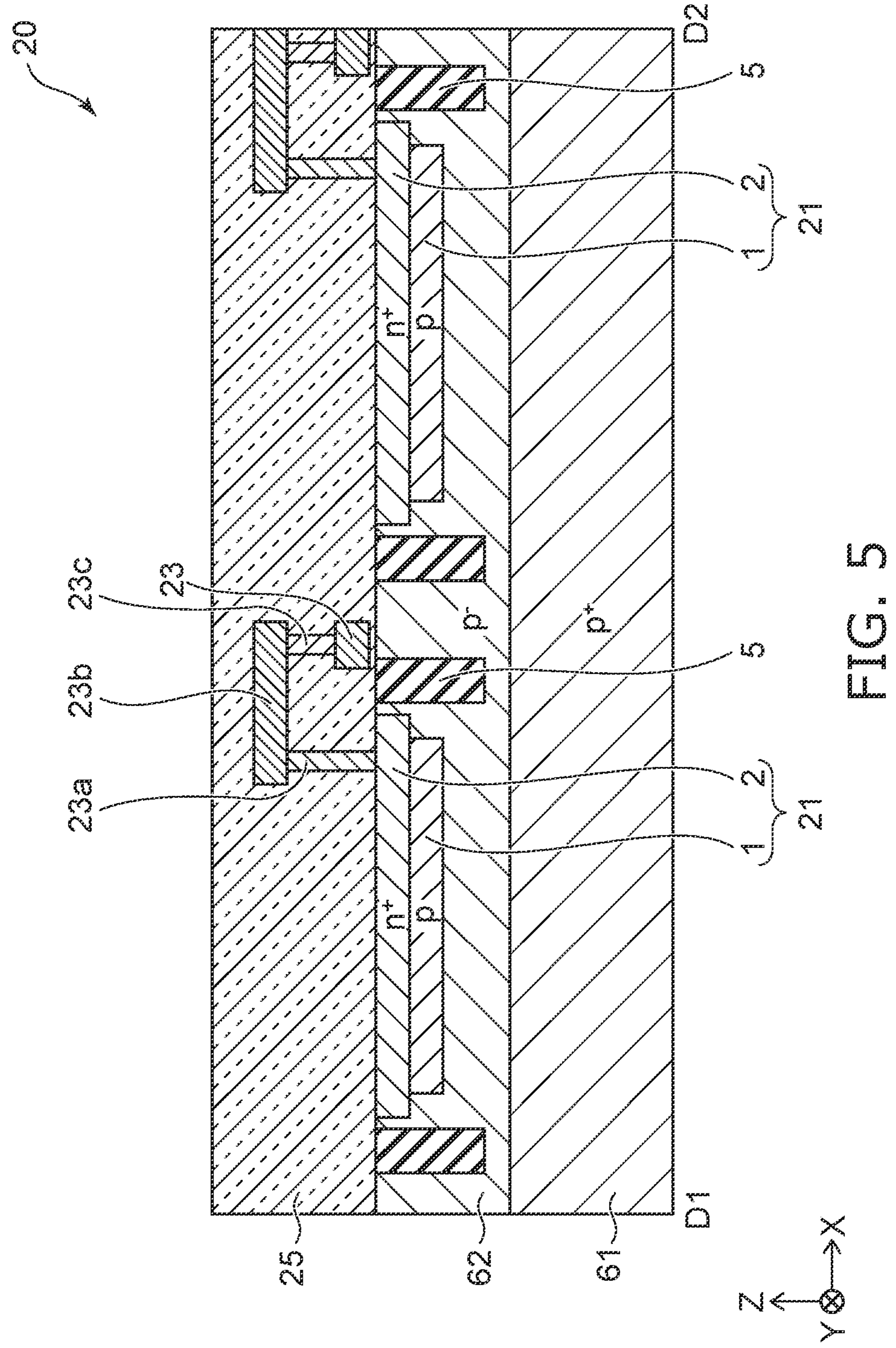
FIG. 5 is a D1-D2 cross-sectional view of FIG. 4.

FIG. 4 is an enlarged plan view of portion C of FIG. 1. FIG. 5 is a D1-D2 cross-sectional view of FIG. 4.

As shown in FIGS. 4 and 5, the second region 20 includes a second semiconductor light detection element 21, a second quenching part 23, a second interconnect 24, and an insulating layer 25.

Similarly to the first semiconductor light detection element 11, the second semiconductor light detection element 21 includes the p-type semiconductor region 1 and the $n^+$-type semiconductor region 2. The insulating part 5 is located around the p-type semiconductor region 1 and the $n^+$-type semiconductor region 2 in the X-Y plane. The insulating layer 25 is light-transmissive and is located on the second semiconductor light detection element 21. No lens is located directly above the second semiconductor light detection element 21 at a position in the Z-direction of the lens 21. The second region 20 may not include a lens. Or, another lens larger than the lens 21 may be provided directly above the second semiconductor light detection element 21. In such a case, the other lens is located directly above multiple second semiconductor light detection element 21. In other words, no lenses corresponding to individual second elements are provided, in the second region 20. A position in the Z-direction of the other lens may be different from a position in the Z-direction of the lens 21, or may be the same as the position in the Z-direction of the lens 21.

The $n^+$-type semiconductor region 2 of the second semiconductor light detection element 21 is electrically connected with the second quenching part 23 via a contact plug 23*a*, an interconnect 23*b*, and a contact plug 23*c*. The second quenching part 23 is electrically connected with the second interconnect 24. In other words, the second quenching part 23 is electrically connected between the second semiconductor light detection element 21 and the second interconnect 24.

Multiple second semiconductor light detection elements 21 are arranged in the X-direction and the Y-direction. The second quenching part 23 is electrically connected with at least one second semiconductor light detection element 21. Multiple second interconnects 24 are arranged in the Y-direction. Each second interconnect 24 is electrically connected with multiple second semiconductor light detection elements 21 arranged in the X-direction. The multiple second interconnects 24 are electrically connected with the pad electrode 52.

The first semiconductor light detection element 11 and the second semiconductor light detection element 21 have substantially the same characteristics. For example, the p-type impurity concentration, thickness, and width of the p-type semiconductor region 1 of the first semiconductor light detection element 11 are respectively equal to the p-type impurity concentration, thickness, and width of the p-type semiconductor region 1 of the second semiconductor light detection element 21. The n-type impurity concentration, thickness, and width of the $n^+$-type semiconductor region 2 of the first semiconductor light detection element 11 are respectively equal to the n-type impurity concentration, thickness, and width of the $n^+$-type semiconductor region 2 of the second semiconductor light detection element 21. The thickness is the dimension in the Z-direction. The width is a dimension in the X-direction or the Y-direction.

As shown in FIGS. 3 and 5, the first region 10 and the second region 20 are located on a $p^+$-type semiconductor layer 61 (a first semiconductor layer) and a $p^-$-type semiconductor layer 62. The $p^-$-type semiconductor layer 62 is located on the $p^+$-type semiconductor layer 61. The p-type impurity concentration of the $p^-$-type semiconductor layer 62 is less than the p-type impurity concentration of the $p^+$-type semiconductor layer 61. The p-type impurity concentration of the p-type semiconductor region 1 is greater than the p-type impurity concentration of the $p^-$-type semiconductor layer 62.

The p-type semiconductor region 1 is electrically connected with the $p^+$-type semiconductor layer 61 via the $p^-$-type semiconductor layer 62. A back electrode may be located under the $p^+$-type semiconductor layer 61. A voltage is applied to the multiple first semiconductor light detection elements 11 by applying a voltage between the $p^+$-type semiconductor layer 61 and the pad electrode 51. A voltage is applied to the multiple second semiconductor light detection elements 21 by applying a voltage between the $p^+$-type semiconductor layer 61 and the pad electrode 52.

A reverse voltage is applied between the p-type semiconductor region 1 and the $n^+$-type semiconductor region 2. For example, the first semiconductor light detection element 11 and the second semiconductor light detection element 21 function as p-i-n diodes or avalanche photodiodes (APDs). A voltage that is much greater than the breakdown voltage may be applied between the p-type semiconductor region 1 and the $n^+$-type semiconductor region 2. In other words, the first semiconductor light detection element 11 and the second semiconductor light detection element 21 may be APDs that operate in a Geiger mode. By operating in a Geiger mode, a pulse signal is output at a high multiplication factor. The light-receiving sensitivity of the first and second semiconductor light detection elements 11 and 21 can be increased thereby.

Each first semiconductor light detection element 11 and each second semiconductor light detection element 21 can detect light. The first semiconductor light detection element 11 detects light that is concentrated by the first lens 12 and is incident on the first semiconductor light detection element 11. The second semiconductor light detection element 21 detects light that is incident on the second semiconductor light detection element 21 without passing through a lens. A charge is generated in the $p^+$-type semiconductor layer 61, the $p^-$-type semiconductor layer 62, or the p-type semiconductor region 1 when light is incident on the first semiconductor light detection element 11 or the second semiconductor light detection element 21 from above. The charge flows toward the pad electrodes; and currents are generated. The incidence of the light on the first region 10 or the second region 20 can be detected from the current based on the charge.

When the first semiconductor light detection element 11 and the second semiconductor light detection element 21 operate in a Geiger mode, the first quenching part 13 and the second quenching part 23 are electrically connected as shown in FIGS. 2 to 5. The first quenching part 13 and the second quenching part 23 are omissible when the first semiconductor light detection element 11 and the second semiconductor light detection element 21 do not operate in a Geiger mode or are p-i-n diodes.

The first quenching part 13 and the second quenching part 23 suppress the continuation of avalanche breakdown when avalanche breakdown occurs. The electrical resistances of the first quenching part 13 and the electrical resistance of the second quenching part 23 each are greater than the electrical resistances of the contact plugs, the interconnects, etc. It is favorable for the electrical resistance of the first quenching part 13 and the electrical resistance of the second quenching part 23 each to be not less than 50 kΩ and not more than 6 MΩ. A voltage drop that corresponds to the electrical resistance occurs when avalanche breakdown occurs and a current flows in the first quenching part 13 or the second quenching part 23. The potential difference between the p-type semiconductor region 1 and the $n^+$-type semiconductor region 2 is reduced by the voltage drop, and the avalanche breakdown stops. Thereby, the first semiconductor light detection element 11 and the second semiconductor light detection element 21 can have a fast response with a short time constant, and the next incident light can be detected again.

In the light detection device 100, the surface area of the first region 10 is greater than the surface area of the second region 20. In other words, the number of the first semiconductor light detection elements 11 located in the first region 10 is greater than the number of the second semiconductor light detection elements 21 located in the second region 20. The first region 10 that includes the first lens 12 is the main region for light detection. The second region 20 is provided as a reference region for the inspection.

An example of materials of the components will now be described.

The p-type semiconductor region 1, the $n^+$-type semiconductor region 2, the $p^+$-type semiconductor layer 61, and the $p^-$-type semiconductor layer 62 include at least one semiconductor material selected from the group consisting of silicon, silicon carbide, gallium arsenide, and gallium nitride. When these semiconductor regions include silicon, for example, phosphorus, arsenic, or antimony is used as the n-type impurity. Boron or boron fluoride is used as the p-type impurity.

The $p^+$-type semiconductor layer 61 is, for example, a portion of a semiconductor substrate. The $p^-$-type semiconductor layer 62 is formed by epitaxial growth on the $p^+$-type semiconductor layer 61. The p-type semiconductor region 1 and the $n^+$-type semiconductor region 2 are formed by ion implantation into the $p^-$-type semiconductor layer 62.

The insulating part 5, the insulating layer 15, and the insulating layer 25 include an insulating material. For example, the insulating part 5, the insulating layer 15, and the insulating layer 25 include silicon oxide or silicon nitride. The first quenching part 13 and the second quenching part 23 include polysilicon. An n-type impurity or a p-type impurity may be added to the first and second quenching parts 13 and 23. The pad electrode 51, the pad electrode 52, the contact plugs, and the interconnects include a metal material such as tungsten, titanium, copper, aluminum, etc.

The first lens 12 includes a light-transmissive resin. The resin has a different refractive index from the semiconductor material. An acrylic resin is favorable as the resin. The acrylic resin may be a resin into which propylene glycol monomethyl ether acetate is mixed.

Figure 6:
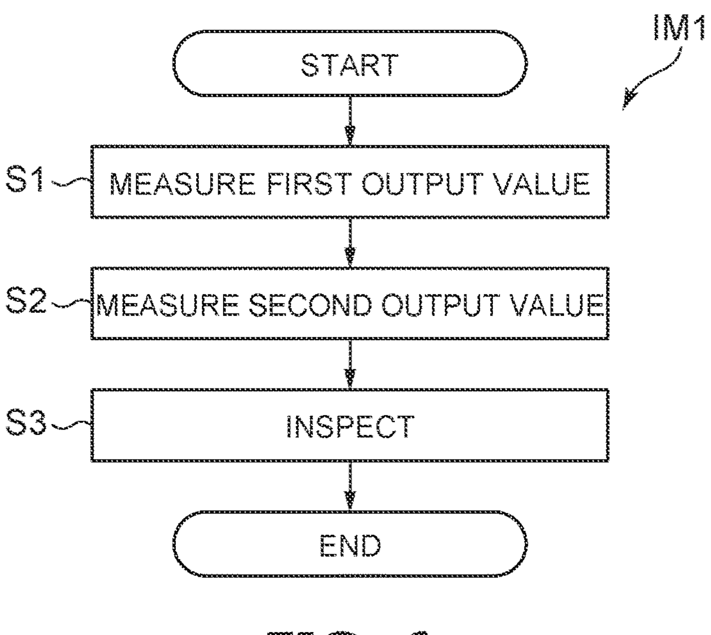
FIG. 6 is a flowchart showing an inspection method according to the first embodiment.

FIG. 6 is a flowchart showing an inspection method according to the first embodiment.

In the inspection method IM1 shown in FIG. 6, a first voltage is applied to the multiple first semiconductor light detection elements 11 of the light detection device 100; and a first output value when light is irradiated on the multiple first semiconductor light detection elements 11 via the first lenses 12 is measured (step S1). The first voltage is applied to the multiple second semiconductor light detection elements 21 of the light detection device 100; and a second output value when light is irradiated on the multiple second semiconductor light detection elements 21 without passing through a lens is measured (step S2). Light of the same intensity is irradiated on the first and second regions 10 and 20 in steps S1 and S2. Step S2 may be performed before step S1. Steps S1 and S2 may be simultaneously performed. The light detection device 100 is inspected by using the measured first and second output values (step S3).

Figure 7:
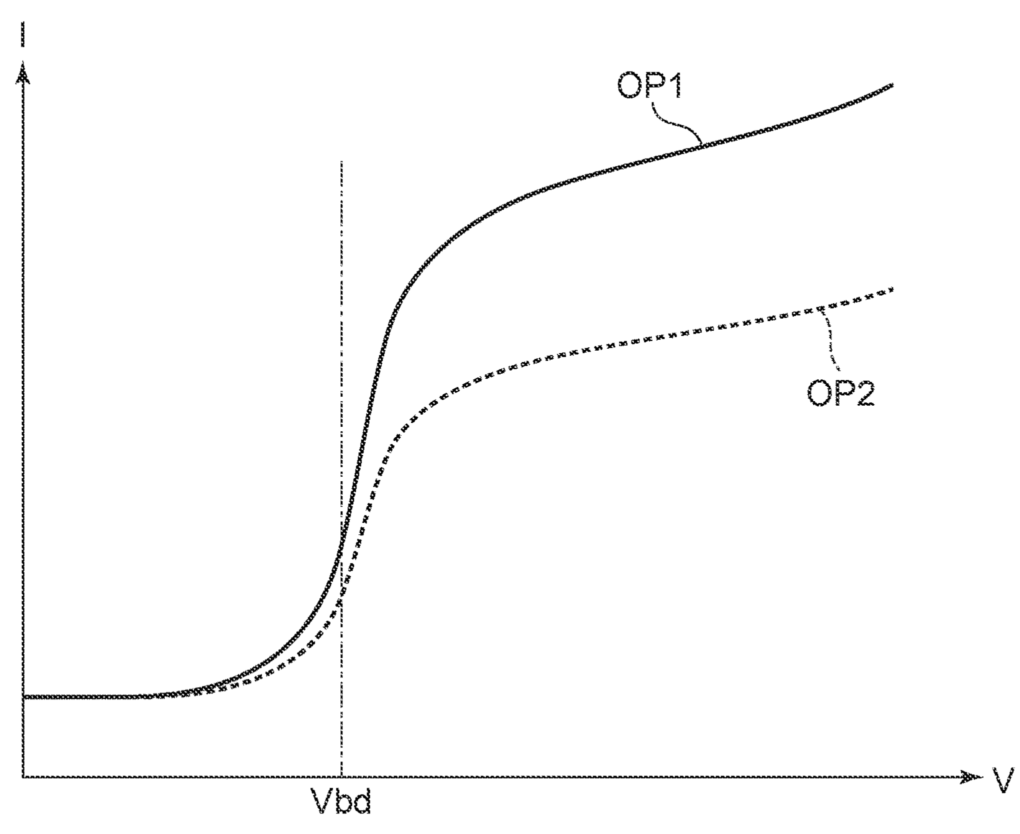
FIG. 7 is a graph illustrating outputs of the light detection device according to the first embodiment.

FIG. 7 is a graph illustrating outputs of the light detection device according to the first embodiment.

In FIG. 7, the horizontal axis is a voltage V. The vertical axis is a current I. The solid line shows a first output value OP1 from the multiple first semiconductor light detection elements 11. The broken line shows a second output value OP2 from the multiple second semiconductor light detection elements 21. FIG. 7 shows the outputs when the voltage applied to the first and second semiconductor light detection elements 11 and 21 is increased while irradiating light of the same intensity on the first and second regions 10 and 20. Light is concentrated on the first semiconductor light detection elements 11 by the first lenses 12. Therefore, the first output value OP1 from the multiple first semiconductor light detection elements 11 is greater than the second output value OP2 from the multiple second semiconductor light detection elements 21.

The first output value OP1 and the second output value OP2 are respectively dependent on the number of the first semiconductor light detection elements 11 and the number of the second semiconductor light detection elements 21. One of the first output value OP1 or the second output value OP2 is corrected when the number of the second semiconductor light detection elements 21 is different from the number of the first semiconductor light detection elements 11. For example, the first output value OP1 is multiplied by (1/N) when the number of the first semiconductor light detection elements 11 is N times the number of the second semiconductor light detection elements 21. FIG. 7 shows the corrected first and second output values OP1 and OP2.

The corrected first output value OP1 is approximately represented by the following Formula 1.

$$Ia_{(v)}=A\times(DCR_{(v)})\times(\text{Gain}_{(v)})+B\times(PDE_{(v)})\times(\text{Gain}_{(v)}) \quad (1)$$

$Ia_{(v)}$ is the current output from the multiple first semiconductor light detection elements 11 at the voltage V and corresponds to the first output value OP1. A and B are coefficients that are appropriately set according to the characteristics of the light detection device 100 and the measurement environment such as the intensity of the irradiated light, etc. $DCR_{(v)}$ is the thermal noise count (the dark count) per unit time at the voltage V. $\text{Gain}_{(v)}$ is the multiplication factor at the voltage V. The current (the dark current) caused by the thermal noise generated in the first region 10 can be approximately represented by the value of the product of $DCR_{(v)}$ and $\text{Gain}_{(v)}$ multiplied by the unit conversion coefficient A. $PDE_{(v)}$ is the light detection efficiency at the voltage V. The current (the bright current) caused by the light detection occurring in the first region 10 can be approximately represented by the value of the product of $PDE_{(v)}$ and $\text{Gain}_{(v)}$ multiplied the coefficient B for unit conversion and measurement environment correction.

The second output value OP2 is approximately represented by the following Formula 2.

$$Ib_{(v)}=A\times(DCR_{(v)})\times(\text{Gain}_{(v)})+B\times(1/M)\times(PDE_{(v)})\times(\text{Gain}_{(v)}) \quad (2)$$

$Ib_{(v)}$ is the current output from the multiple second semiconductor light detection elements 21 at the voltage V and corresponds to the second output value OP2. M is the increase rate of the detection efficiency amplified by the first lens 12 and is pre-calculated. No lens is located on the second semiconductor light detection element 21. Therefore, the light detection efficiency of the second semiconductor light detection element 21 is (1/M) times the light detection efficiency of the first semiconductor light detection element 11. The second semiconductor light detection element 21 has substantially the same characteristics as the first semiconductor light detection element 11. Therefore, $DCR_{(v)}$, $\text{Gain}_{(v)}$, $PDE_{(v)}$, A, and B of Formula 2 are respectively equal to $DCR_{(v)}$, $\text{Gain}_{(v)}$, $PDE_{(v)}$, A, and B of Formula 1.

The first term of Formula 1 is the same as the first term of Formula 2. The second term of Formula 1 is M times the second term of Formula 2. Here, the first terms of Formulas 1 and 2 are called a "reference value". The value of the second term of Formula 1 is called a "first inspection value". The value of the second term of Formula 2 is called a "second inspection value". The reference value is pre-acquired from a measurement result of the light detection device 100 to be inspected.

The multiple first semiconductor light detection elements 11, the multiple first lens 12, the multiple second semiconductor light detection elements 21, etc., are formed according to predesigned conditions, and when normal, have a first inspection value that is about M times the second inspection value. For example, the tolerance range of the first inspection value is set by using M times the second inspection value as the reference. In step S3, the multiple first semiconductor light detection elements 11 and the multiple first lens 12 are determined to be normal when the first inspection value is within the tolerance range. In other words, it is determined that the main region is normal, and the light detection device 100 is normal. When the first inspection value is outside the tolerance range, it is determined that the multiple first semiconductor light detection elements 11 or the multiple first lens 12 are abnormal and the light detection device 100 is abnormal (not normal). The tolerance range is set according to the fluctuation of the output values, the acceptable fluctuation of the characteristics, etc.

According to the inspection method IM1, it may be determined that the light detection device 100 is abnormal even when the second output value is abnormal due to an abnormality in a portion of the multiple second semiconductor light detection elements 21. The embodiment is directed to easily and highly-accurately find the light detection devices 100 that may be abnormal. Therefore, according to the inspection method IM1, the light detection device 100 is determined to be abnormal when the second output value is abnormal and/or when the first output value is abnormal.

Figure 8:
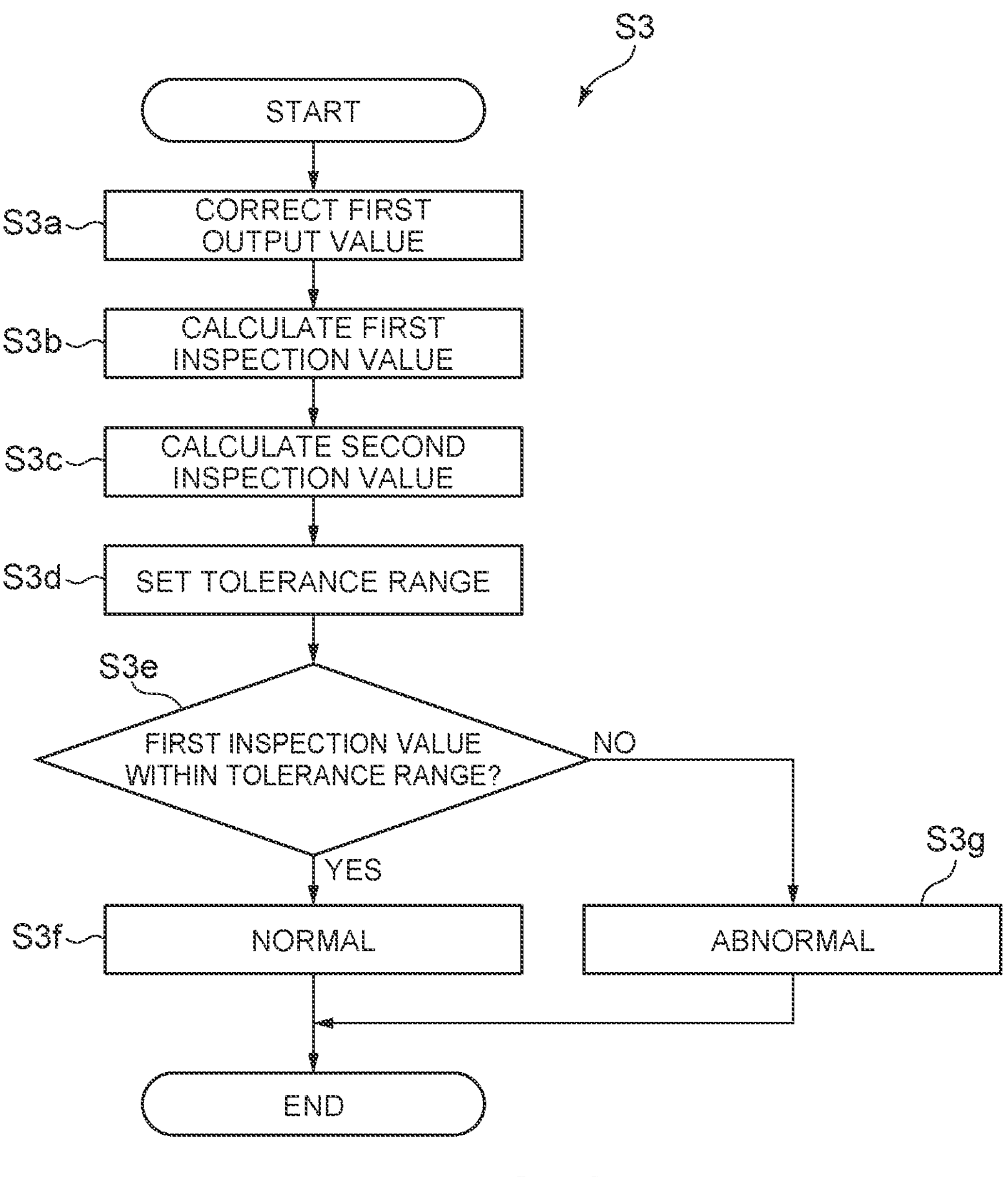
FIG. 8 is a flowchart showing specific processing of the inspection.

FIG. 8 is a flowchart showing specific processing of the inspection.

FIG. 8 shows a specific inspection procedure of the light detection device 100. The first output value is corrected according to the ratio of the number of the first semiconductor light detection elements 11 and the number of the second semiconductor light detection elements 21 (step S3*a*). The first inspection value, i.e., the difference between the reference value and the corrected first output value, is calculated (step S3*b*). The second inspection value, i.e., the difference between the second output value and the reference value, is calculated (step S3*c*). The tolerance range is set using the second inspection value as the reference (step S3*d*). It is determined whether or not the first inspection value is within the tolerance range (step S3*e*). When the first inspection value is within the tolerance range, the light detection device 100 is determined to be normal (step S3*f*). When the first inspection value is outside the tolerance range, the light detection device 100 is determined to be abnormal (step S3*g*).

When the output value fluctuation is large, the average of output values obtained at multiple voltages may be calculated. For example, the first output value from the multiple first semiconductor light detection elements 11 is measured at multiple mutually-different voltages. Similarly, the second output value from the multiple second semiconductor light detection elements 21 is measured at multiple mutually-different voltages. The first inspection value, i.e., the difference between the reference value and the average value of the multiple first output values, is calculated. The second inspection value, i.e., the difference between the reference value and the average value of the multiple second output values, is calculated. The light detection device 100 is inspected using the first inspection value, the second inspection value, and the increase rate M.

In the example described above, the tolerance range that is referenced to the second inspection value is set, and the first inspection value and the tolerance range are compared. The tolerance range is not limited to the example; a tolerance range that is referenced to (1/M) times the first inspection value may be set, and the second inspection value and the tolerance range may be compared.

Multiple tolerance ranges may be set. For example, a first range and a second range that is greater than the first range are set by using M times the second inspection value as the reference. When the first inspection value is within the second range, it is determined that the light detection device 100 is normal and is a good part. When the first inspection value is within the first range, it is determined that the light detection device 100 is normal and is a superior part.

As shown in FIG. 7, the output is large when the voltage V is greater than a breakdown voltage Vbd. Also, the difference between the first output value OP1 and the second output value OP2 is large. It is therefore favorable for the first voltage that is set when measuring the first output value OP1 and the second output value OP2 to be greater than the breakdown voltage. In particular, the output can be further increased by applying a first voltage such that the semiconductor light detection elements can operate in Geiger mode.

Advantages of the light detection device according to the first embodiment will now be described.

The light detection device 100 includes the first region 10 that includes the first lens 12, and the second region 20 that does not include a lens. The pad electrodes 51 and 52 are provided respectively to obtain the output from the first region 10 and the output from the second region 20. By including the pad electrodes 51 and 52, the output of the first region 10 and the output of the second region 20 can be separately obtained. The first region 10 that is the main region can be easily inspected by using these outputs. According to the first embodiment, the light detection device 100 that can be easily inspected is provided.

Advantages of the inspection method according to the first embodiment will now be described.

There is an inspection method of a light detection device that multiply repeats an output waveform measurement when light is not irradiated on the semiconductor light detection elements and an output waveform measurement when exceedingly faint light of about one photon per unit element is irradiated. In this method, a large amount of measured data is analyzed to separate characteristics (output characteristics) such as the light detection capability of the light detection device, noise characteristics, and the magnitude of the output when detecting; and the light detection device is inspected based on the characteristics. However, in such an inspection method, the time necessary for the inspection is too long. When the inspection method according to the reference example is used in the mass production of the light detection device, the inspection method is applicable only in the inspections of some light detection devices as in a sampling inspection. An easier inspection method that can inspect more (e.g., all) of the light detection devices in mass production is desirable.

In the inspection method according to the first embodiment, the first output value is measured when the first voltage is applied to the multiple first semiconductor light detection elements 11, and light is irradiated on the multiple first semiconductor light detection elements 11 via the multiple first lens 12. The second output value is measured when the same first voltage is applied to the multiple second semiconductor light detection elements 21, and light is irradiated on the multiple second semiconductor light detection elements 21 without passing through a lens. If the light detection device 100 is normal, the difference between these output values corresponds to the increase rate M of the light detection efficiency due to the lens as described above. The light detection device 100 can be easily inspected by using the first and second output values. According to the first embodiment, an inspection method that can easily inspect more light detection devices is provided.

Figure 9:
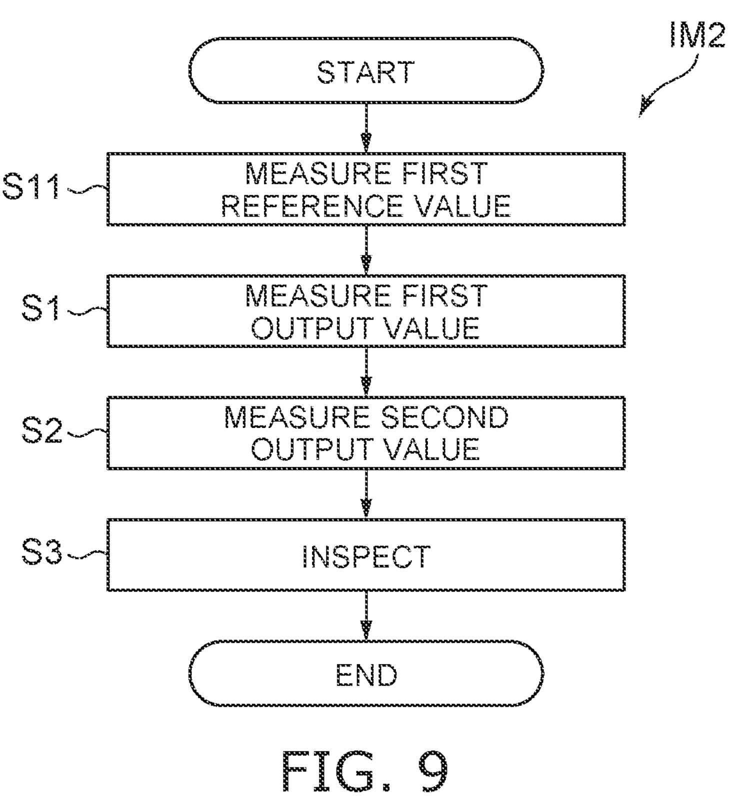
FIG. 9 is a flowchart showing other inspection methods according to the first embodiment.
Figure 10:
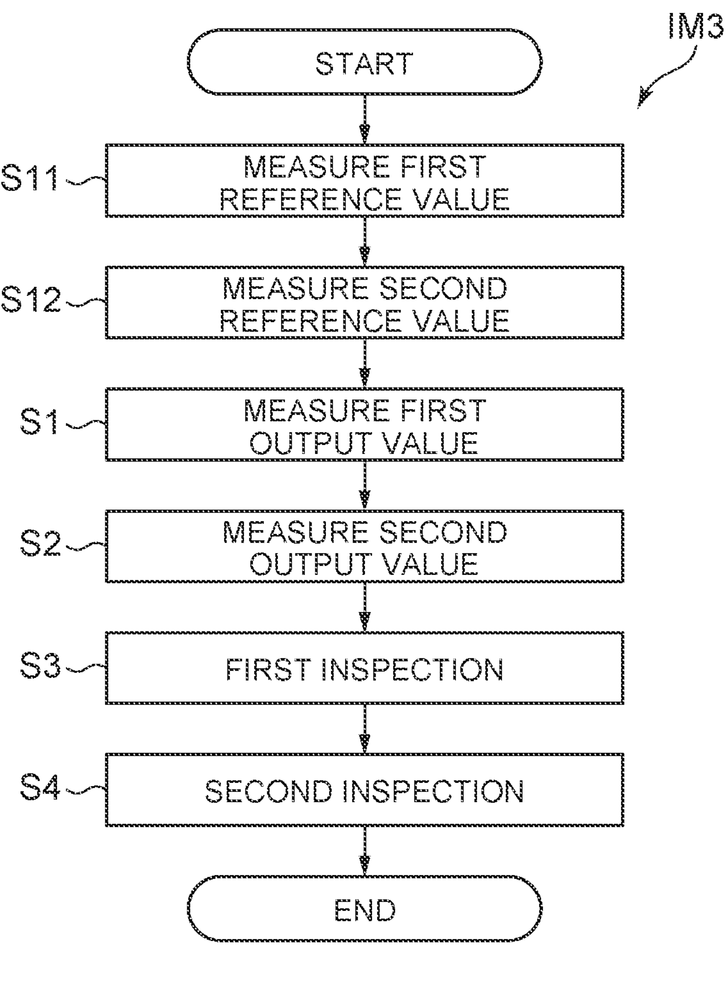
FIG. 10 is a flowchart showing other inspection methods according to the first embodiment.

FIGS. 9 and 10 are flowcharts showing other inspection methods according to the first embodiment.

Compared to the inspection method IM1 shown in FIG. 6, an inspection method IM2 shown in FIG. 9 further includes step S11. In step S11, a first reference value is measured when the first voltage is applied to the multiple first semiconductor light detection elements 11, and light is not irradiated.

When light is not irradiated, a current that is caused by light does not flow in the first semiconductor light detection element 11. The value of the coefficient B related to the intensity of the irradiated light is zero in Formula 1. The output from the pad electrode 51 corrected according to the ratio of the number of the first semiconductor light detection elements 11 and the number of the second semiconductor light detection elements 21 is approximately represented by the following Formula 3.

$$Ic_{(v)}=A\times(DCR_{(v)})\times(\mathrm{Gain}_{(v)}) \quad (3)$$

The current $Ic_{(v)}$ corresponds to the value of the first terms of Formulas 1 and 2. In other words, in the inspection method IM2, a reference value for obtaining the first and second inspection values is measured.

In the inspection method IM2, the output may be measured when light is not irradiated on the multiple second semiconductor light detection elements 21 to which the first voltage is applied. This output also can be used as the first reference value. This is because the first semiconductor light detection element 11 and the second semiconductor light detection element 21 have substantially the same characteristics.

Compared to the inspection method IM2 shown in FIG. 9, an inspection method IM3 shown in FIG. 10 further includes step S12. In step S11, the first reference value is measured when light is not irradiated on the multiple first semiconductor light detection elements 11 to which the first voltage is applied. In step S12, a second reference value is measured when light is not irradiated on the multiple second semiconductor light detection elements 21 to which the first voltage is applied.

The processing shown in FIG. 8 is performed in a first inspection of step S3. At this time, the first inspection value is the difference between the first output value and the first reference value. The second inspection value is the difference between the second output value and the second reference value.

In a second inspection of step S4, the light detection device 100 is inspected using the first and second reference values. As described above, the first semiconductor light detection element 11 and the second semiconductor light detection element 21 have substantially the same characteristics. Therefore, if the light detection device 100 is normal, the difference between the corrected first and second reference values is small. For example, the difference between the corrected first and second reference values is compared to a preset threshold. If the difference is less than the threshold, the light detection device 100 is determined to be normal. If the difference is not less than the threshold, the light detection device 100 is determined to be abnormal.

According to the inspection method IM3, the light detection device 100 also is inspected using outputs when light is not irradiated. Therefore, compared to the inspection methods IM1 and M2, the accuracy of the inspection can be further increased.

First Modification

Figure 11:
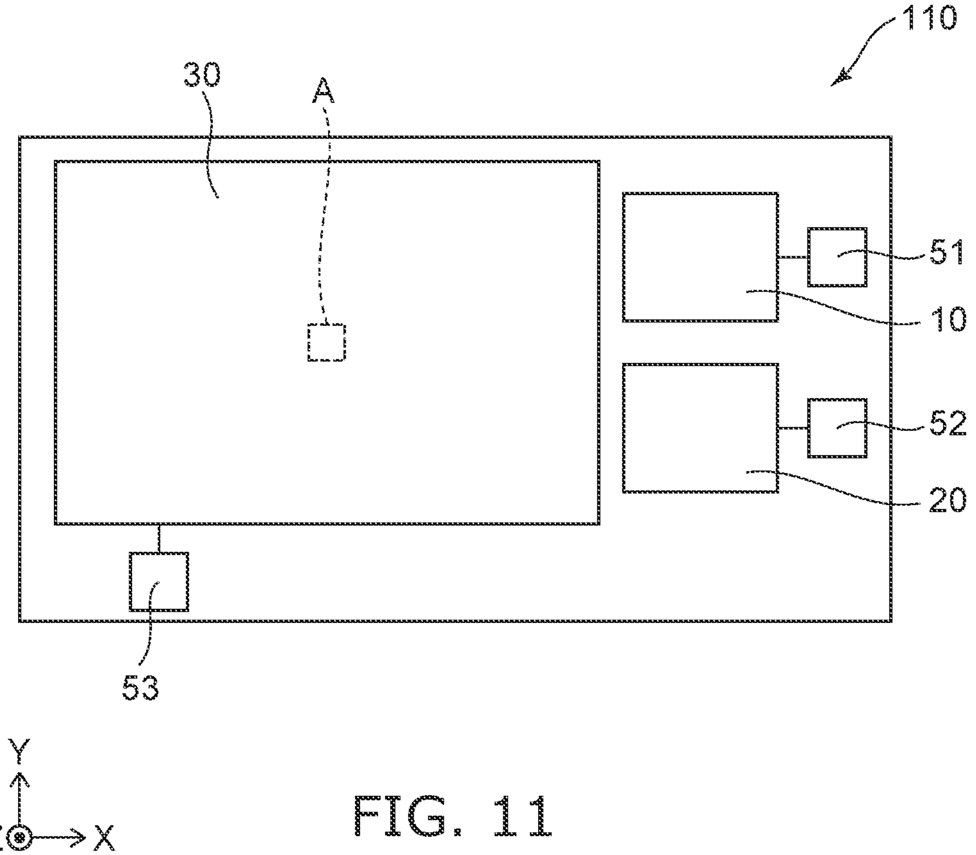
FIG. 11 is a schematic plan view showing a light detection device according to a first modification of the first embodiment.

FIG. 11 is a schematic plan view showing a light detection device according to a first modification of the first embodiment.

As shown in FIG. 11, compared to the light detection device 100, the light detection device 110 according to the first modification further includes a third region 30 and a pad electrode 53 (a third electrode). The structure of the third region 30 of the light detection device 110 is the same as the structure of the first region 10 of the light detection device 100. The surface area of the first region 10 of the light detection device 110 is less than the surface area of the first region 10 of the light detection device 100. The number of the first semiconductor light detection elements 11 located in the first region 10 is equal to the number of the second semiconductor light detection elements 21 located in the second region 20.

Figure 12:
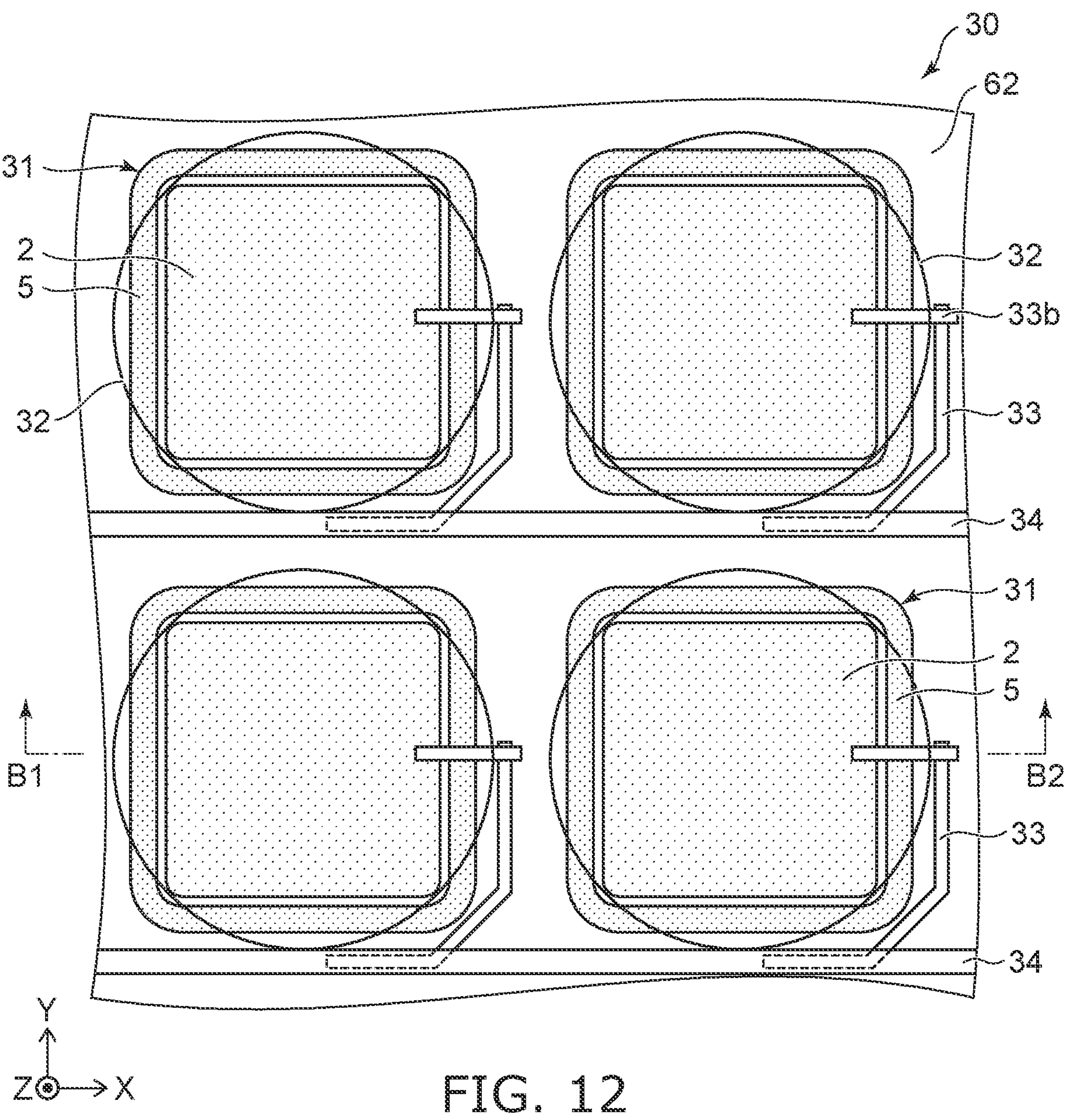
FIG. 12 is an enlarged plan view of portion A of FIG. 11.
Figure 13:
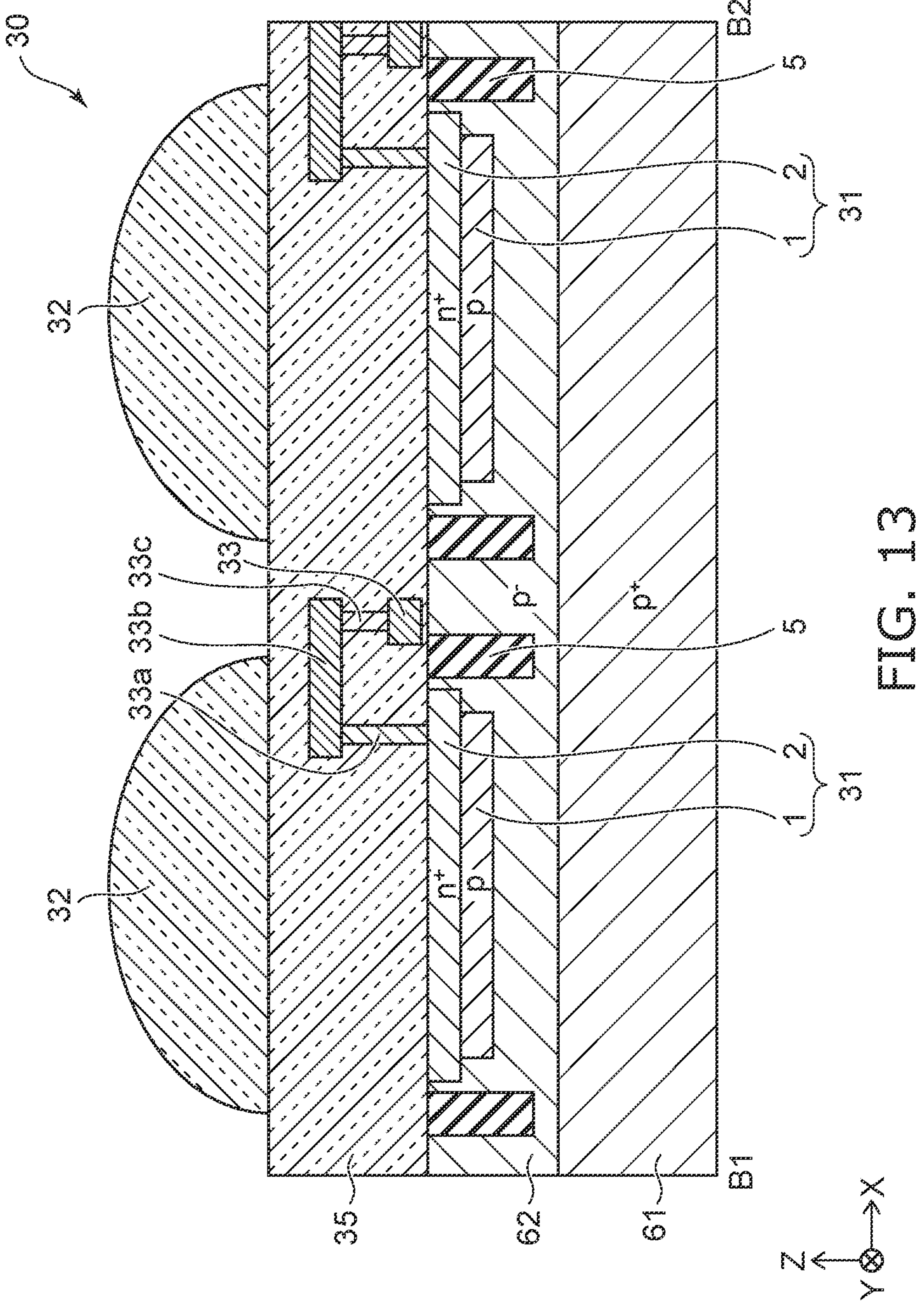
FIG. 13 is a B1-B2 cross-sectional view of FIG. 12.

FIG. 12 is an enlarged plan view of portion A of FIG. 11. FIG. 13 is a B1-B2 cross-sectional view of FIG. 12.

As shown in FIGS. 12 and 13, the third region 30 includes multiple third semiconductor light detection elements 31, multiple second lens 32, multiple third quenching parts 33, multiple third interconnects 34, and an insulating layer 35.

The third semiconductor light detection element 31 has substantially the same characteristics as the first and second semiconductor light detection elements 11 and 21. Each third semiconductor light detection element 31 includes the p-type semiconductor region 1 and the $n^+$-type semiconductor region 2. The insulating part 5 is located around the p-type semiconductor region 1 and the $n^+$-type semiconductor region 2 in the X-Y plane. The insulating layer 35 is light-transmissive and is located on the multiple third semiconductor light detection elements 31. The second lens 32 is located on the insulating layer 35 and positioned on the third semiconductor light detection element 31. The second lens 32 concentrates light toward the corresponding third semiconductor light detection element 31.

The $n^+$-type semiconductor region 2 of the third semiconductor light detection element 31 is electrically connected with the third interconnect 34 via a contact plug 33*a*, an interconnect 33*b*, a contact plug 33*c*, and the third quenching part 33. Each third interconnect 34 is electrically connected with the multiple third semiconductor light detection elements 31 arranged in the X-direction and is electrically connected with the pad electrode 53.

The pad electrode 53 is located at the front side of the light detection device 110. The output value from the multiple third semiconductor light detection elements 31 can be measured via the pad electrode 53. The pad electrode 53 is separated from the pad electrodes 51 and 52 and is electrically isolated from the pad electrodes 51 and 52.

The third region 30 is located on the $p^-$-type semiconductor layer 62. The p-type semiconductor region 1 of the third semiconductor light detection element 31 is electrically connected with the $p^+$-type semiconductor layer 61 via the $p^-$-type semiconductor layer 62. A voltage is applied to the multiple third semiconductor light detection elements 31 by applying a voltage between the $p^+$-type semiconductor layer 61 and the pad electrode 53. For example, the third semiconductor light detection element 31 is a p-i-n diode or an APD. Favorably, the third semiconductor light detection element 31 is an APD that operates in a Geiger mode.

The specific structures of the first and second regions 10 and 20 of the light detection device 110 are similar to the structures shown in FIGS. 2 to 5.

In the light detection device 110, the surface area of the third region 30 is greater than the surface area of the first region 10 and greater than the surface area of the second region 20. In other words, the number of the third semiconductor light detection elements 31 located in the third region 30 is greater than the number of the first semiconductor light detection elements 11 located in the first region 10 and greater than the number of the second semiconductor light detection elements 21 located in the second region 20. In the light detection device 110, the third region 30 is the main region for light detection. The first region 10 and the second region 20 are reference regions for inspection.

The inspection method IM1 shown in FIG. 6 is performed for the light detection device 110. In other words, the first output value from the multiple first semiconductor light detection elements 11 is measured (step S1). The second output value from the multiple second semiconductor light detection elements 21 is measured (step S2). The light detection device 110 is inspected using the measured first and second output values (step S3).

In the inspection of the light detection device 110, the inspection result that uses the multiple first semiconductor light detection elements 11 and the multiple first lens 12 is considered to be the inspection result of the multiple third semiconductor light detection elements 31 and the multiple second lens 32. In other words, when the multiple first semiconductor light detection elements 11 and the multiple first lens 12 are determined to be normal, the multiple third semiconductor light detection elements 31 and the multiple second lens 32 also are considered to be normal, and the light detection device 110 is determined to be normal. When the multiple first semiconductor light detection elements 11 and the multiple first lens 12 are determined to be abnormal, the multiple third semiconductor light detection elements 31 and the multiple second lens 32 also are considered to be abnormal, and the light detection device 110 is determined to be abnormal.

As shown in FIG. 11, the first region 10, the second region 20, and the third region 30 are located on the same $p^+$-type semiconductor layer 61 and $p^-$-type semiconductor layer 62. In other words, the first region 10, the second region 20, and the third region 30 are located inside the same one chip. In mass production, when an abnormality exists in one of the first region 10, the second region 20, or the third region 30, it is highly likely that an abnormality also exists in the other regions. Therefore, the inspection result of the multiple first semiconductor light detection elements 11 and the multiple first lens 12 can be considered to be the inspection result of the light detection device 110.

In the light detection device 100, the first region 10 is the main region, and the surface area of the first region 10 is greater than the surface area of the second region 20. Therefore, the fluctuation of the output from the first semiconductor light detection elements 11 in the first region 10 is greater than the fluctuation of the output from the second semiconductor light detection elements 21 in the second region 20. For example, the fluctuation is caused by the incident light amount difference, the light incident angle difference, etc., between the center and the outer perimeter of the first region 10. Even when the output from each first semiconductor light detection element 11 at the center of the first region 10 is equal to the output from each second semiconductor light detection element 21 in the second region 20, the output from each first semiconductor light detection element 11 at the outer perimeter of the first region 10 may be less than the output from each second semiconductor light detection element 21. Therefore, an appropriate value may not be obtained in the inspection even when the output values are corrected according to the ratio of the number of the first semiconductor light detection elements 11 and the number of the second semiconductor light detection elements 21.

In the light detection device 110, the number of the first semiconductor light detection elements 11 located in the first region 10 is equal to the number of the second semiconductor light detection elements 21 located in the second region 20. Both the first and second regions 10 and 20 are provided as reference regions. It is therefore unnecessary to correct the output from the pad electrode 51 or the output from the pad electrode 52 in the inspection. The number of the first semiconductor light detection elements 11 located in the first region 10 and the number of the second semiconductor light detection elements 21 located in the second region 20 are less than the number of the third semiconductor light detection elements 31 located in the third region 30. Therefore, the fluctuation of the output from the semiconductor light detection elements in these regions is less than the fluctuation of the output from the third semiconductor light detection elements 31 in the third region 30. The accuracy of the inspection can be increased by using the output from the pad electrode 51 and the output from the pad electrode 52 in the inspection.

Second Modification

Figure 14:
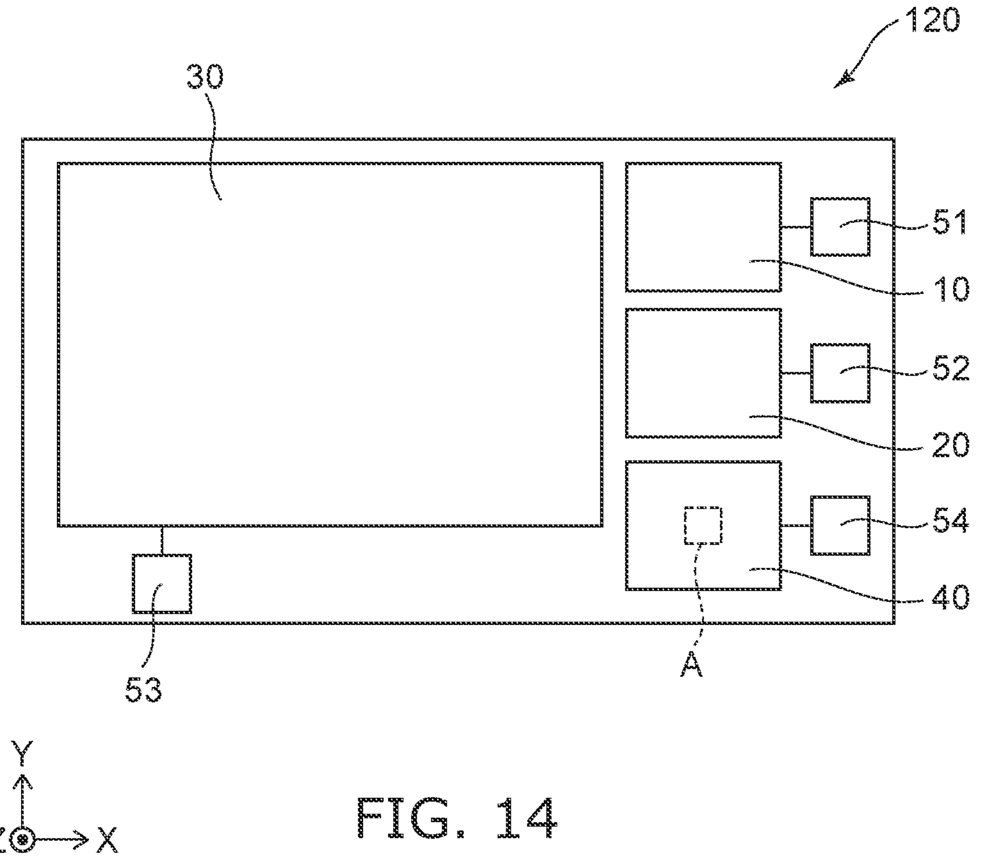
FIG. 14 is a schematic plan view showing a light detection device according to a second modification of the first embodiment.

FIG. 14 is a schematic plan view showing a light detection device according to a second modification of the first embodiment.

As shown in FIG. 14, compared to the light detection device 110, the light detection device 120 according to the second modification further includes a fourth region 40 and a pad electrode 54.

Figure 15:
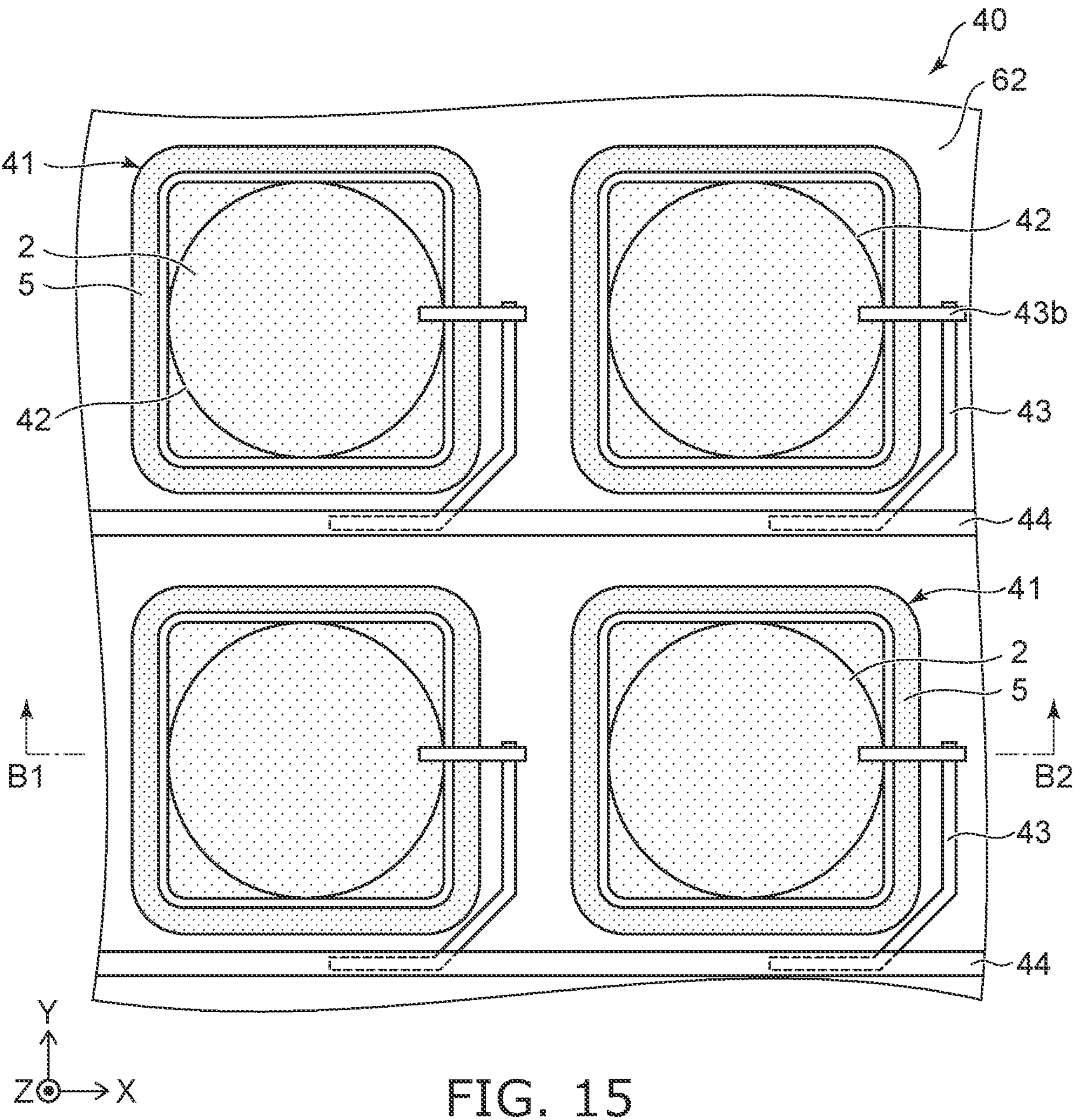
FIG. 15 is an enlarged plan view of portion A of FIG. 14.
Figure 16:
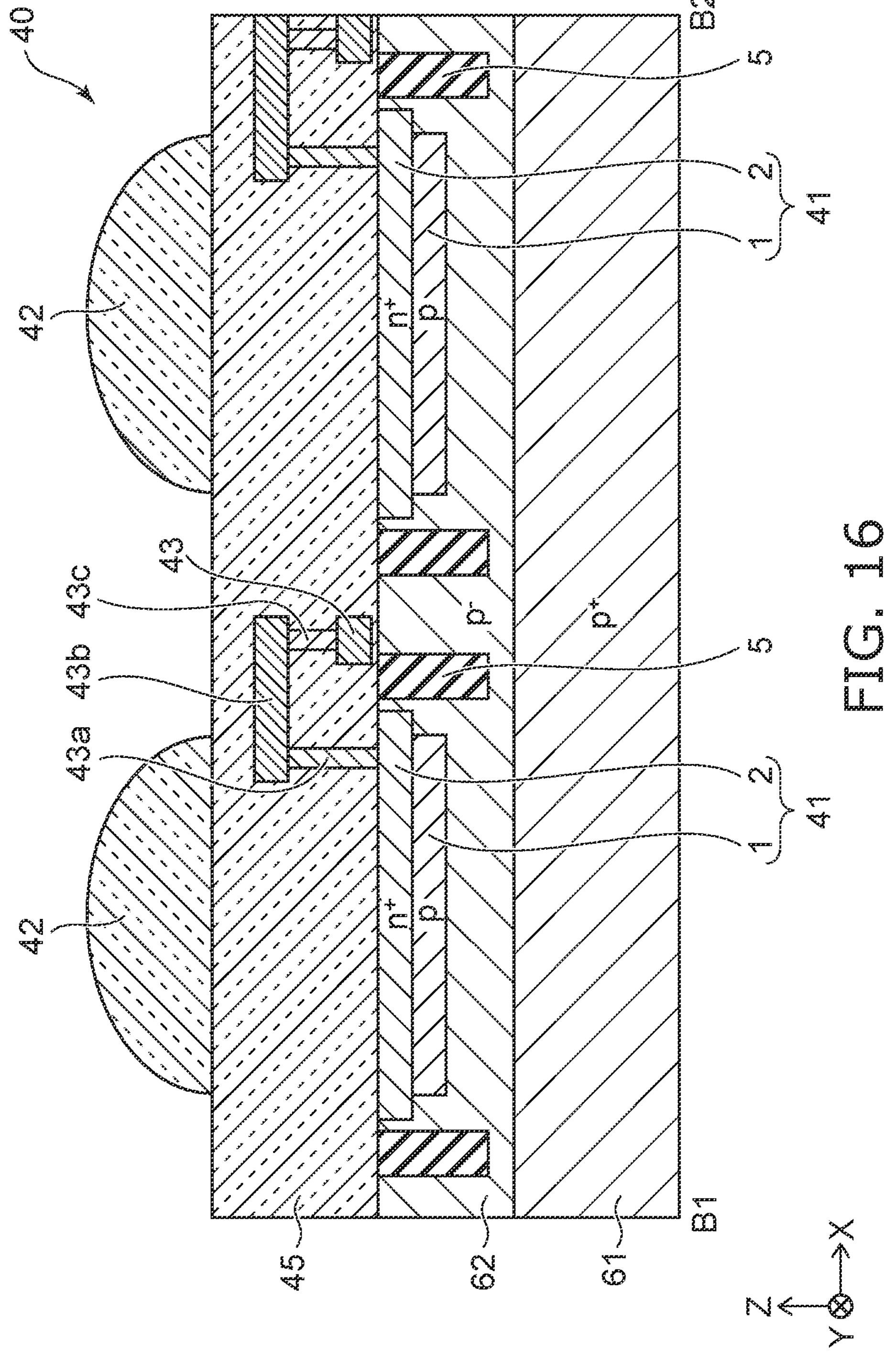
FIG. 16 is a B1-B2 cross-sectional view of FIG. 15.

FIG. 15 is an enlarged plan view of portion A of FIG. 14. FIG. 16 is a B1-B2 cross-sectional view of FIG. 15.

Other than the lens, the structure of the fourth region 40 is the same as the structure of the first region 10. As shown in FIGS. 15 and 16, the fourth region 40 includes multiple fourth semiconductor light detection elements 41, multiple third lens 42, multiple fourth quenching parts 43, multiple fourth interconnects 44, and an insulating layer 45.

Each fourth semiconductor light detection element 41 includes the p-type semiconductor region 1 and the $n^+$-type semiconductor region 2. The insulating part 5 is located around the p-type semiconductor region 1 and the $n^+$-type semiconductor region 2 in the X-Y plane. The insulating layer 45 is light-transmissive and is located on the multiple fourth semiconductor light detection elements 41.

The $n^+$-type semiconductor region 2 of the fourth semiconductor light detection element 41 is electrically connected with the fourth interconnect 44 via a contact plug 43*a*, an interconnect 43*b*, a contact plug 43*c*, and the fourth quenching part 43. Each fourth interconnect 44 is electrically connected with the multiple fourth semiconductor light detection elements 41 arranged in the X-direction and is electrically connected with the pad electrode 54.

The pad electrode 54 is located at the front side of the light detection device 110. The output value of the multiple fourth semiconductor light detection elements 41 can be measured via the pad electrode 54. The pad electrode 54 is separated from the pad electrodes 51 to 53 and electrically isolated from the pad electrodes 51 to 53.

The fourth region 40 is located on the $p^-$-type semiconductor layer 62. The p-type semiconductor region 1 of the fourth semiconductor light detection element 41 is electrically connected with the $p^+$-type semiconductor layer 61 via the $p^-$-type semiconductor layer 62. A voltage is applied to the multiple fourth semiconductor light detection elements 41 by applying a voltage between the $p^+$-type semiconductor layer 61 and the pad electrode 54. For example, the fourth semiconductor light detection element 41 is a p-i-n diode or an APD. Favorably, the fourth semiconductor light detection element 41 is an APD that operates in a Geiger mode.

The third lens 42 is located on the insulating layer 45 and positioned on the fourth semiconductor light detection element 41. The optical characteristics of the third lens 42 are different from the optical characteristics of the second lens 32. For example, the diameter of the third lens 42 shown in FIGS. 15 and 16 is less than the diameter of the second lens 32 shown in FIGS. 12 and 13. The curvature of the upper surface of the third lens 42 may be different from the curvature of the upper surface of the second lens 32. The material of the third lens 42 may be different from that of the second lens 32.

Or, the optical characteristics of the third lens 42 may be the same as the optical characteristics of the second lens 32; and the third lens 42 may be shifted from the fourth semiconductor light detection element 41. For example, in the first region 10, the center in the X-Y plane of the first semiconductor light detection element 11 and the apex of the first lens 12 are arranged in the Z-direction. Similarly, in the third region 30, the center in the X-Y plane of the third semiconductor light detection element 31 and the apex of the second lens 32 are arranged in the Z-direction. In the fourth region 40, the center in the X-Y plane of the fourth semiconductor light detection element 41 and the apex of the second lens 32 are not arranged in the Z-direction.

In any case, the light intensity concentrated toward the fourth semiconductor light detection element 41 by the third lens 42 is less than the light intensity concentrated toward the first semiconductor light detection element 11 by the first lens 12 and less than the light intensity concentrated toward the third semiconductor light detection element 31 by the second lens 32. Accordingly, when the same intensity of light is irradiated on the first region 10, the second region 20, and the fourth region 40, the output per fourth semiconductor light detection element 41 is less than the output per first semiconductor light detection element 11 and less than the output per second semiconductor light detection element 21.

The number of the fourth semiconductor light detection elements 41 located in the fourth region 40 is equal to the number of the first semiconductor light detection elements 11 located in the first region 10 and equal to the number of the second semiconductor light detection elements 21 located in the second region 20.

In the inspection of the light detection device 120, in addition to the first and second output values, a third output value is measured when light is irradiated on the multiple fourth semiconductor light detection elements 41 to which the first voltage is applied. A third output value $Id_{(v)}$ is approximately represented by the following Formula 4.

$$Id_{(v)}=A\times(DCR_{(v)})\times(\mathrm{Gain}_{(v)})+B\times(L/M)\times(PDE_{(v)})\times(\mathrm{Gain}_{(v)}) \quad (4)$$

$Id_{(v)}$ is the current output from the multiple fourth semiconductor light detection elements 41 at the voltage V. L is the increase rate of the detection efficiency amplified by the third lens 42 and is pre-calculated. The increase rate L is less than the increase rate M. The fourth semiconductor light detection element 41 has substantially the same characteristics as the first semiconductor light detection element 11. Therefore, $DCR_{(v)}$, $\mathrm{Gain}_{(v)}$, $PDE_{(v)}$, A, and B of Formula 4 are respectively equal to $DCR_{(v)}$, $\mathrm{Gain}_{(v)}$, $PDE_{(v)}$, A, and B of Formula 1.

A third inspection value that is the difference between the third output value and the reference value is calculated. When the light detection device 120 is normal, the third inspection value is (LIM) times the second inspection value. For example, the tolerance range for the third inspection value is set using (LIM) times the second inspection value as the reference. The light detection device 120 is determined to be abnormal when the third inspection value is outside the tolerance range.

According to the second modification, the light detection device 120 can be inspected using more indices. Therefore, the accuracy of the inspection can be further increased.

Third Modification

Figure 17:
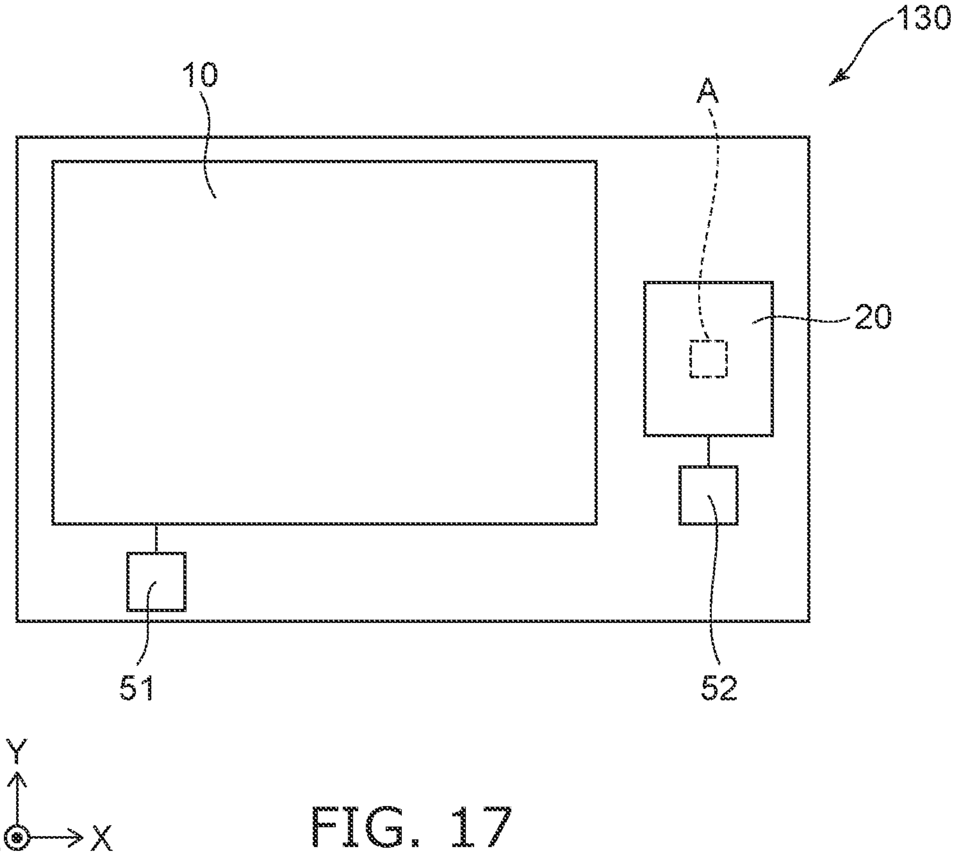
FIG. 17 is a schematic plan view showing an example of a light detection device according to a third modification of the first embodiment.
Figure 18:
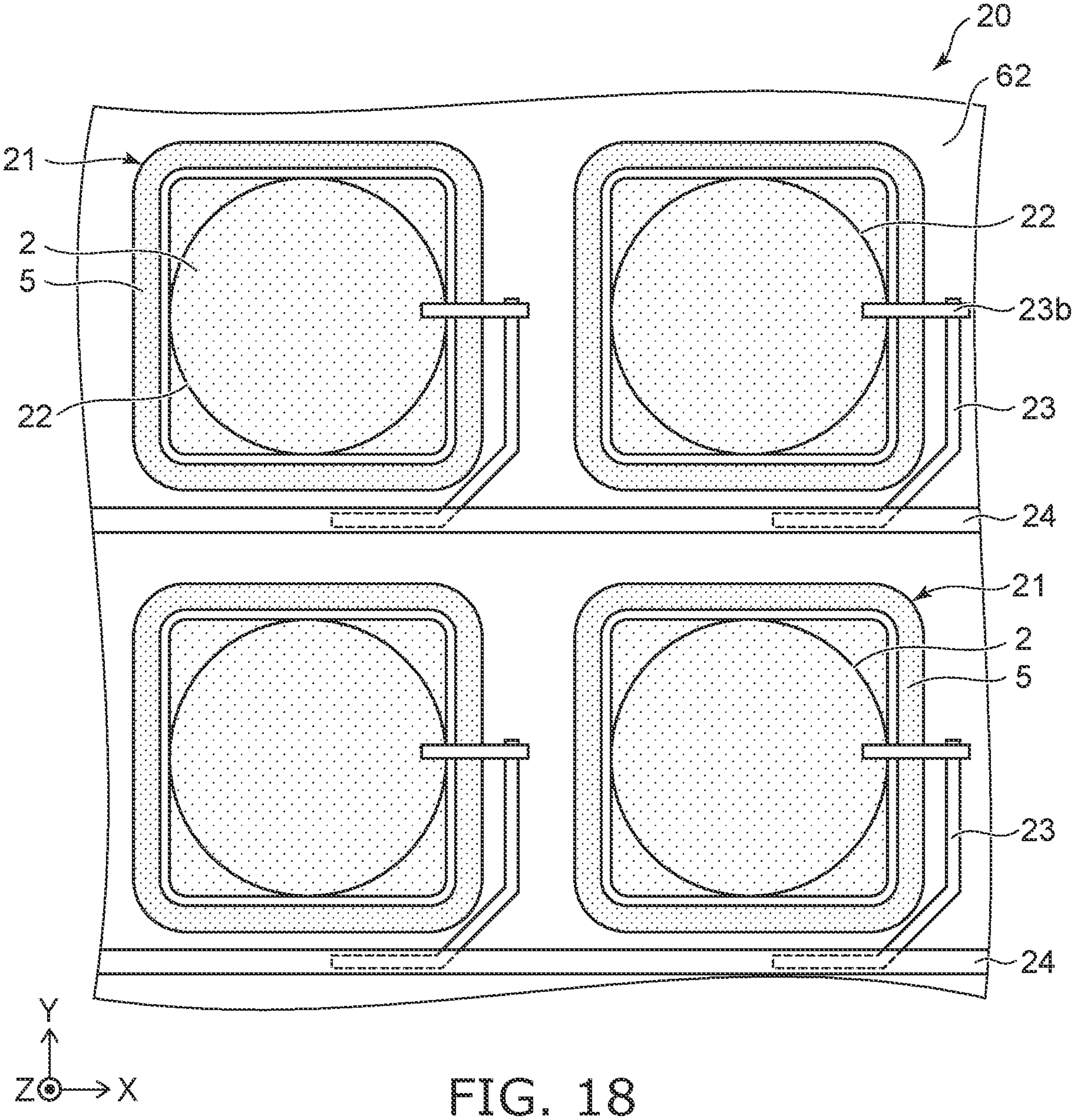
FIG. 18 is an enlarged plan view of portion A of FIG. 17.

FIG. 17 is a schematic plan view showing an example of a light detection device according to a third modification of the first embodiment. FIG. 18 is an enlarged plan view of portion A of FIG. 17.

As shown in FIG. 17, similarly to the light detection device 100, the light detection device 130 according to the third modification includes the first region 10, the second region 20, the pad electrode 51, and the pad electrode 52. However, as shown in FIG. 18, the light detection device 130 differs from the light detection device 100 in that a lens 22 is located in the second region 20. A position in the Z-direction of the lens 22 may be the same as a position in the Z-direction of the lens 21.

The optical characteristics of the lens 22 are different from the optical characteristics of the first lens 12. For example, the diameter of the lens 22 is less than the diameter of the first lens 12. The curvature of the upper surface of the lens 22 may be different from the curvature of the upper surface of the first lens 12. The material of the lens 22 may be different from that of the first lens 12. Or, the optical characteristics of the lens 22 may be the same as the optical characteristics of the first lens 12; and the lens 22 may be shifted from the second semiconductor light detection element 21.

Figure 19:
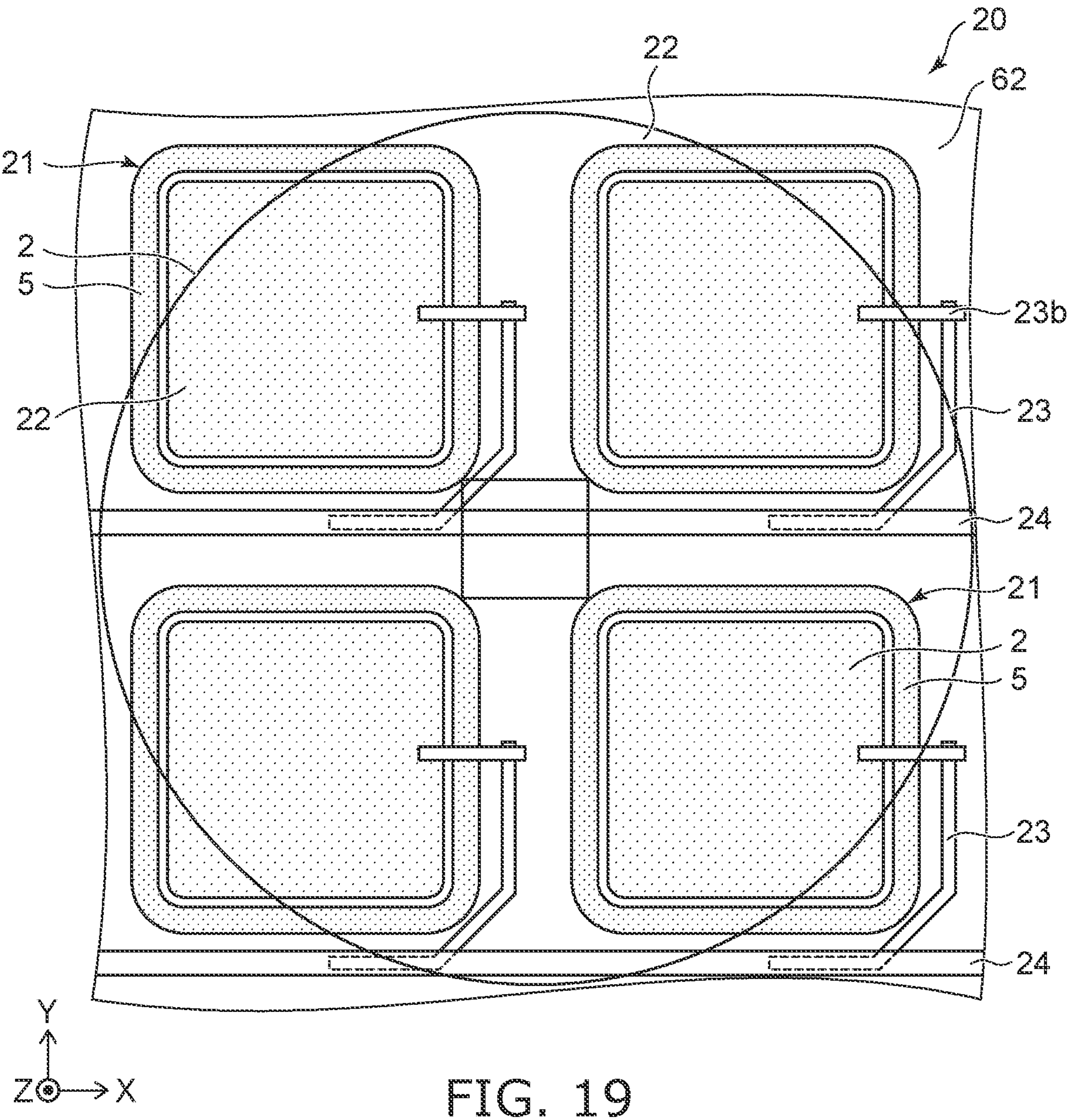
FIG. 19 is a schematic plan view showing another example of a light detection device according to the third modification of the first embodiment.

FIG. 19 is a schematic plan view showing another example of a light detection device according to the third modification of the first embodiment;

Other than the example shown in FIG. 18, the lens 22 may be larger than the lens 12 and one lens 22 may be located directly above multiple second semiconductor light detection elements 21. In such a case, a number of the lenses 22 is different from a number of the second semiconductor light detection elements 21.

In any case, the light amount concentrated toward the second semiconductor light detection element 21 by the lens 22 is less than the light amount concentrated toward the first semiconductor light detection element 11 by the first lens 12. When the same intensity of light is irradiated on the first and second regions 10 and 20, the output per second semiconductor light detection element 21 is less than the output per first semiconductor light detection element 11.

The inspection method shown in FIG. 6 can be performed for the light detection device 130. For example, the second output value from the multiple second semiconductor light detection elements 21 is represented by $Id_{(v)}$ of Formula 4, where L is the increase rate of the detection efficiency amplified by the lens 22. The increase rate L is less than the increase rate M. When the light detection device 130 is normal, the first inspection value is (M/L) times the second inspection value. For example, the tolerance range for the first inspection value is set using (M/L) times the second inspection value as the reference. When the first inspection value is within the tolerance range, the light detection device 130 is determined to be normal. When the first inspection value is outside the tolerance range, the light detection device 130 is determined to be abnormal.

Even when the lens 22 is located in the second region 20 as in the light detection device 130, the inspection can be performed if there is a concentrated light intensity difference between the first lens 12 and the lens 22. However, it is favorable for the difference between the first output value and the second output value to be large to increase the accuracy of the inspection. Accordingly, it is favorable not to provide a lens in the second region 20 to increase the inspection accuracy.

Figure 20:
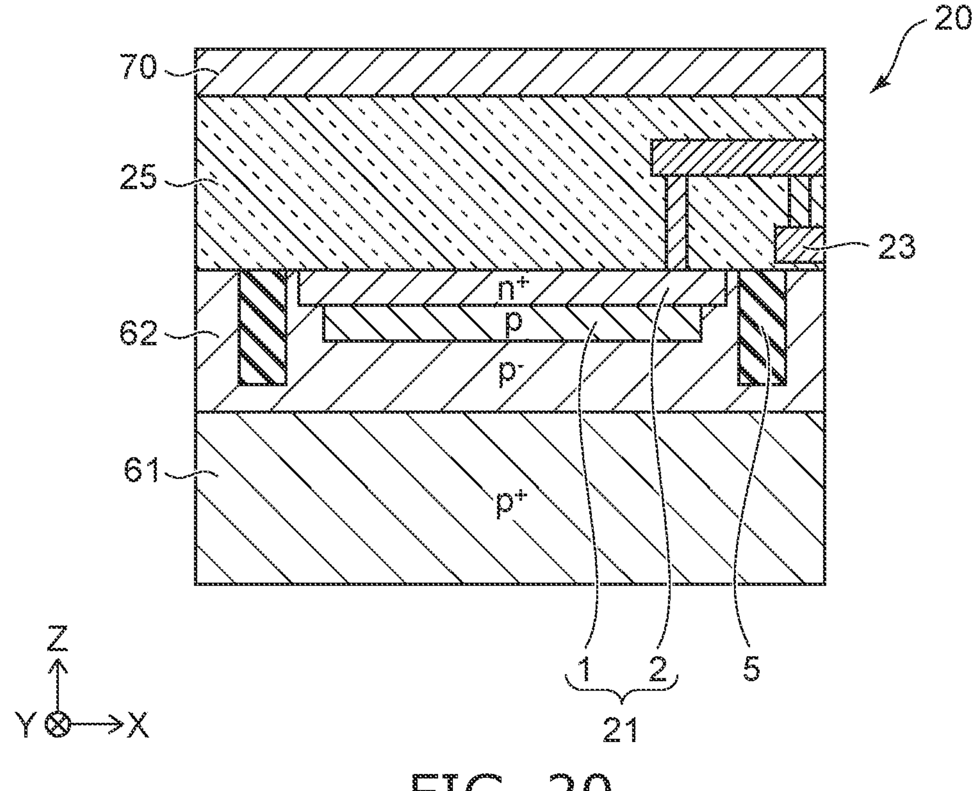
FIG. 20 is a schematic cross-sectional view showing a portion of the light detection device according to the first embodiment.

FIG. 20 is a schematic cross-sectional view showing a portion of the light detection device according to the first embodiment.

In the application, "lens" refers to a member of which the upper surface has curvature and concentrates light toward the semiconductor light detection element. For example, in the second region 20 as shown in FIG. 20, a resin layer 70 may be located above the second semiconductor light detection element 21. The upper surface and the lower surface of the resin layer 70 are flat along the X-Y plane. Therefore, the resin layer 70 is not a "lens". Also, a filter that transmits only specific wavelengths of light, etc., may be included in the light detection device 100. Such a member is not a "lens" if the upper surface and the lower surface of the member are substantially flat.

Figure 21:
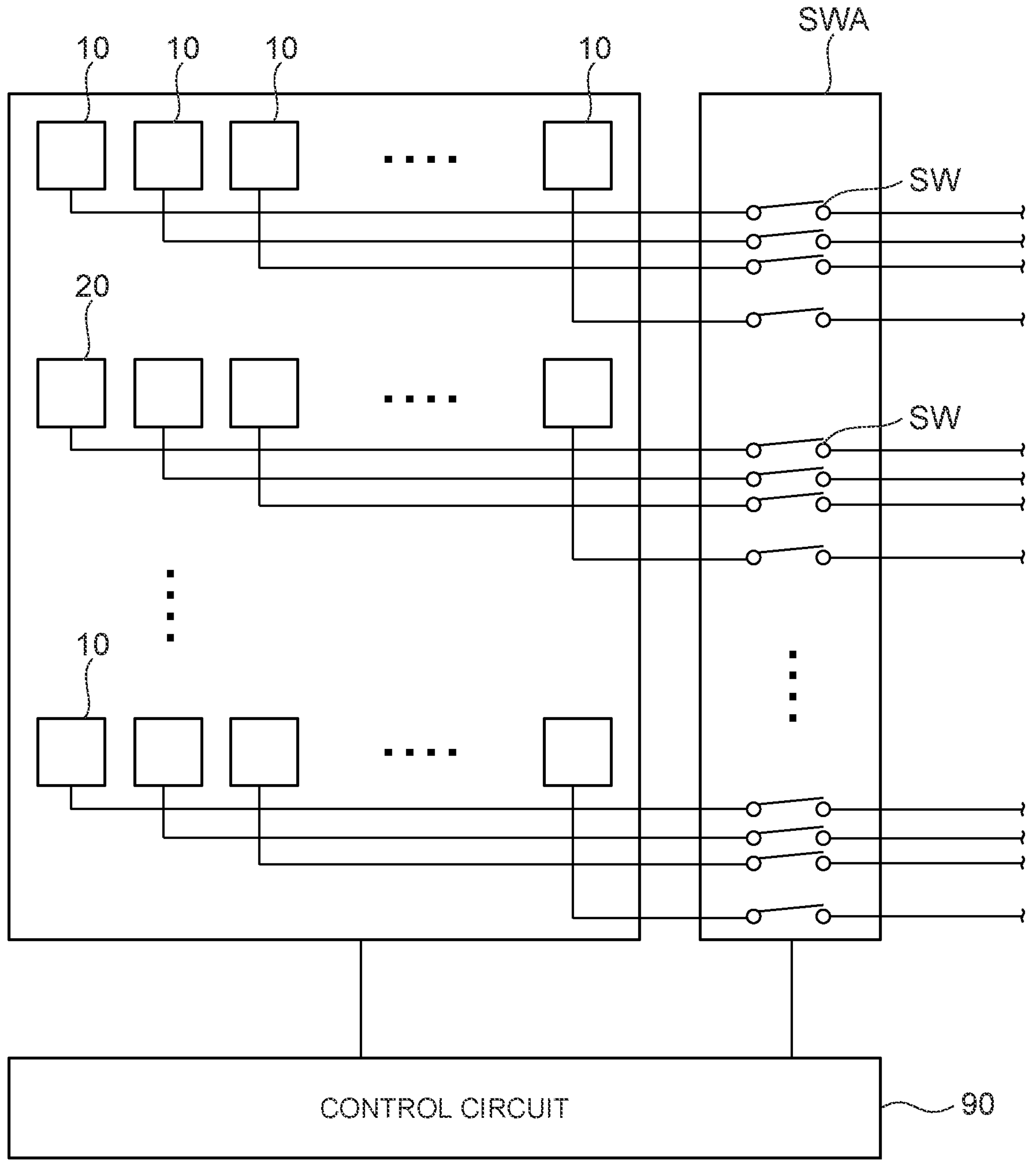
FIG. 21 is a schematic view illustrating an active quenching circuit.

FIG. 21 is a schematic view illustrating an active quenching circuit.

When the semiconductor light detection element operates in a Geiger mode, a resistor that generates a voltage drop is included as the quenching part as described above. A switching element may be included instead of the resistor. In other words, an active quenching circuit for generating the voltage drop may be included as the quenching part.

As shown in FIG. 21, the active quenching circuit includes a switching array SWA. The switching array SWA includes multiple switching elements SW. For example, as shown in FIG. 21, one switching element SW may be provided for one first semiconductor light detection element 11 in the first region 10.

One switching element SW may be provided for multiple first semiconductor light detection elements 11. For example, one switching element SW is located between the first interconnect 14 and one $n^+$-type semiconductor region 2. Or, the switching element SW may be located between the first interconnect 14 and the pad electrode 51. Similarly to the first region 10, the switching element SW also can be located in regions other than the first region 10.

Figure 22A:
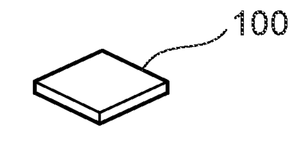
FIGS. 22A and 22B are schematic views illustrating the inspection object.
Figure 22B:
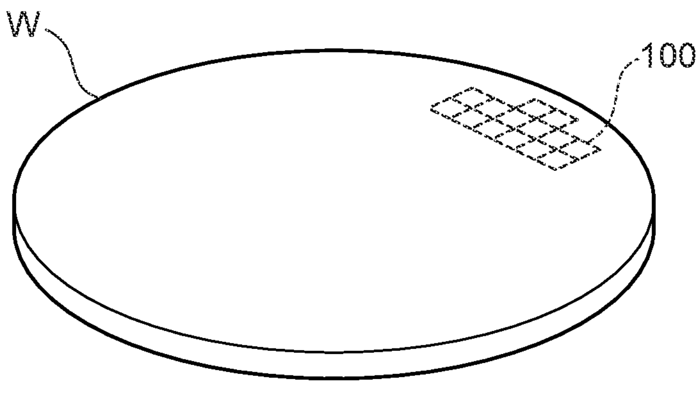

FIGS. 22A and 22B are schematic views illustrating the inspection object.

The light detection device 100 that is inspected by the inspection method according to the first embodiment may be singulated as shown in FIG. 22A. As shown in FIG. 22B, the inspection may be performed on one or more of the multiple light detection devices 100 formed in a semiconductor wafer W. The inspection can be similarly performed on the light detection devices 110 to 130.

Second Embodiment

Figure 23:
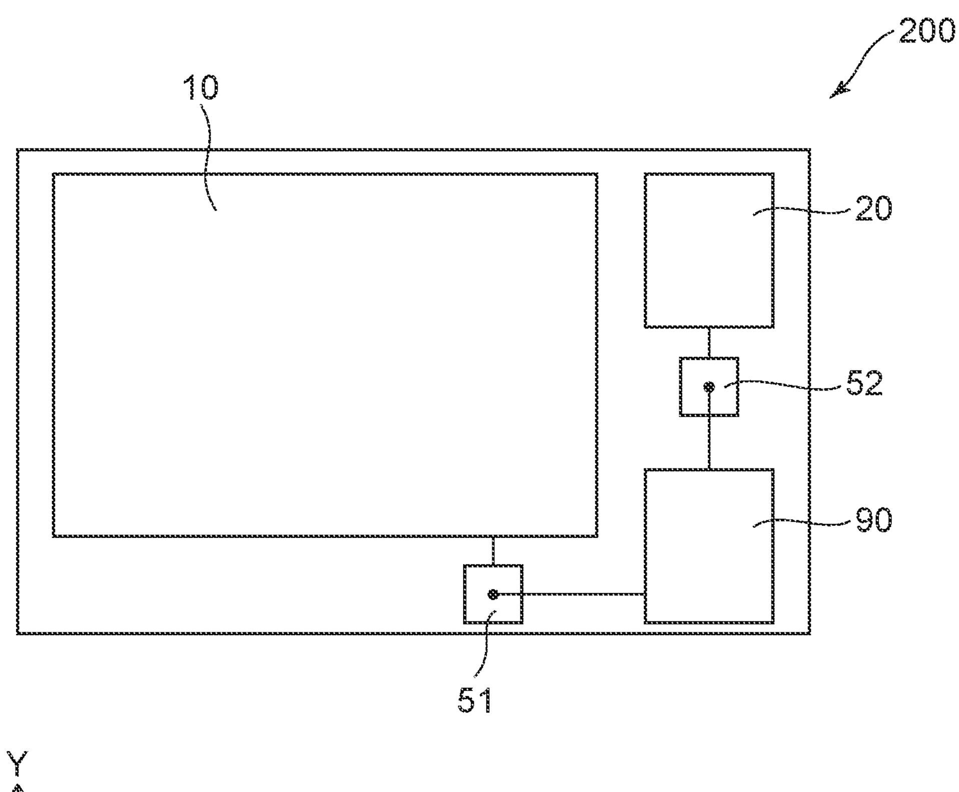
FIG. 23 is a schematic plan view showing a light detection device according to a second embodiment.

FIG. 23 is a schematic plan view showing a light detection device according to a second embodiment.

Compared to the light detection device according to the first embodiment, the light detection device 200 according to the second embodiment further includes a processing circuit 90. The processing circuit 90 is electrically connected with the pad electrode 51, the pad electrode 52, and the $p^+$-type semiconductor layer 61.

The processing circuit 90 performs the inspection method according to the first embodiment. The processing circuit 90 applies the first voltage to the multiple first semiconductor light detection elements 11. The processing circuit 90 measures the first output value when light is irradiated on the multiple first semiconductor light detection elements 11 via the first lenses 12. The processing circuit 90 applies the first voltage to the multiple second semiconductor light detection elements 21. The processing circuit 90 measures the second output value when light is irradiated on the multiple second semiconductor light detection elements 21. The processing circuit 90 inspects the multiple first semiconductor light detection elements 11 and the multiple first lens 12 by using the first and second output values.

As shown in FIG. 23, the processing circuit 90 for performing the inspection may be embedded in the light detection device 200. By embedding the processing circuit 90 in the light detection device 200, it is unnecessary to prepare a measurement device and extract the output from the light detection device 200. The inspection can be easily performed.

Third Embodiment

Figure 24:
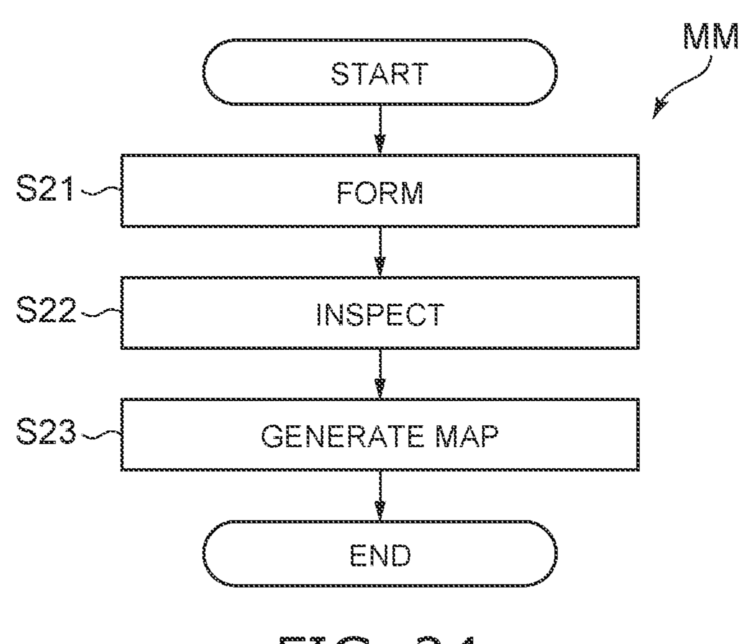
FIG. 24 is a flowchart showing a manufacturing method according to a third embodiment.

FIG. 24 is a flowchart showing a manufacturing method according to a third embodiment.

The manufacturing method MM shown in FIG. 24 is related to the method for manufacturing the semiconductor device up to the formation of the light detection device in the semiconductor wafer. The manufacturing method MM of the semiconductor device includes steps S21 to S23. In step S21, multiple light detection devices are formed in the semiconductor wafer. In step S22, the light detection devices are inspected. In step S22, one of the inspection methods IM1 to IM3 is performed. In step S23, a wafer map is generated based on the inspection results of the light detection devices.

Figure 25:
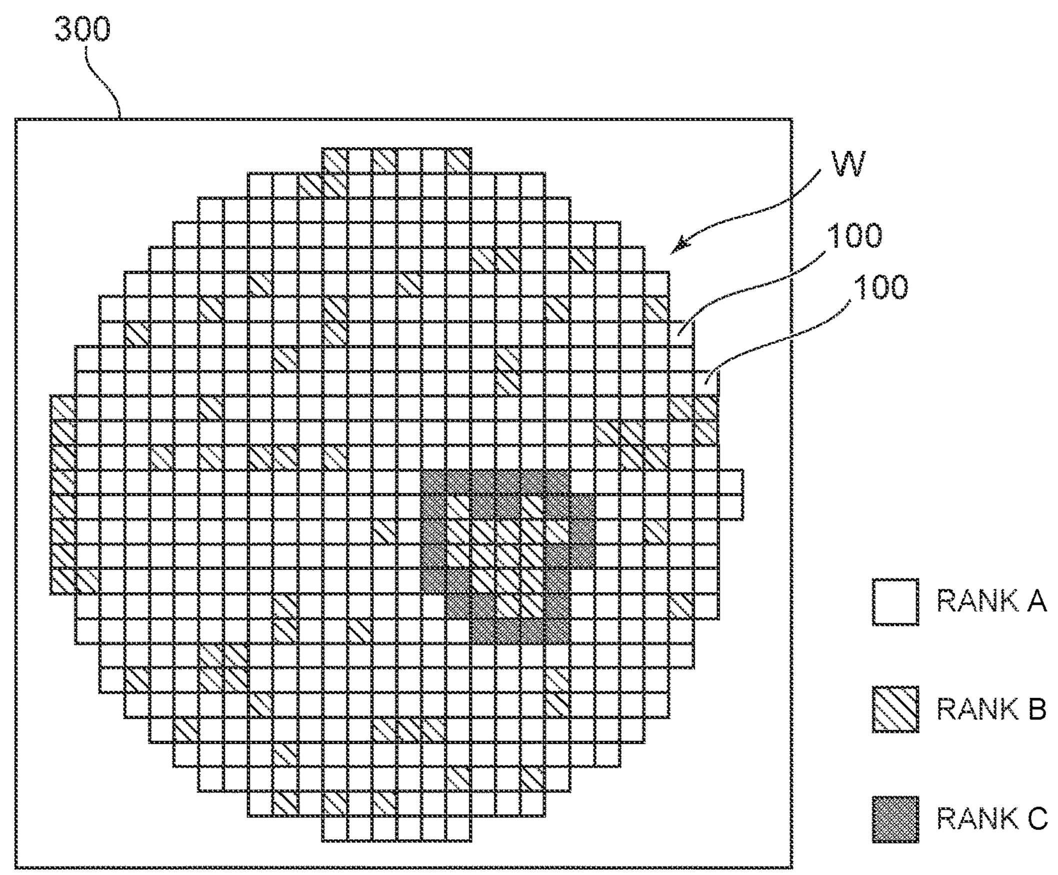
FIG. 25 is a schematic view illustrating a wafer map.

FIG. 25 is a schematic view illustrating the wafer map.

A wafer map 300 shows the positions of the light detection devices in the semiconductor wafer and the inspection results of the light detection devices. For example, as shown in FIG. 25, the multiple light detection devices that are formed in the semiconductor wafer are shown. The display forms of the light detection devices are determined according to the inspection results. In the example of FIG. 25, the light detection devices are ranked in three levels according to the inspection. The light detection devices without hatching are of the highest quality. The quality degrades as the density of the hatching increases.

The wafer map 300 that is generated is associated with the inspected semiconductor wafer W. According to the manufacturing method MM, a semiconductor wafer that is associated with the inspection results of the light detection devices is obtained.

First Modification

Figure 26:
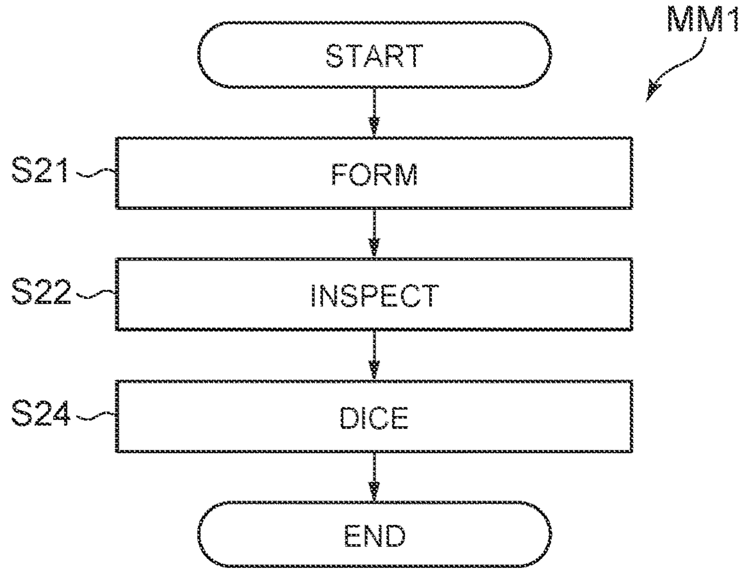
FIG. 26 is a flowchart showing a manufacturing method according to the first modification of the third embodiment.

FIG. 26 is a flowchart showing a manufacturing method according to a first modification of the third embodiment.

The manufacturing method MM1 shown in FIG. 26 is related to the method for manufacturing the light detection device. Compared to the manufacturing method MM, the manufacturing method MM1 includes step S24 instead of step S23. The semiconductor wafer is diced in step S24. The light detection devices that are included in the semiconductor wafer are singulated thereby. Subsequently, the light detection devices that are normal and determined to be good parts in the inspection are packaged in a packaging process.

The light detection devices that are abnormal and determined to be defective parts in the inspection are disposed of without being packaged. Or, the inspection conditions for the defective parts may be adjusted. For example, if a high light detection sensitivity can be realized using a higher operating voltage, light detection devices that are determined to be defective parts may be determined to be good parts according to another inspection standard, or may be considered to be products with slightly poorer performance than a good part. Or, defective parts may be recycled, and at least a portion of the materials may be recovered. According to the manufacturing method MM1, the light detection device can be manufactured while evaluating the quality in a short period of time.

Figure 27:
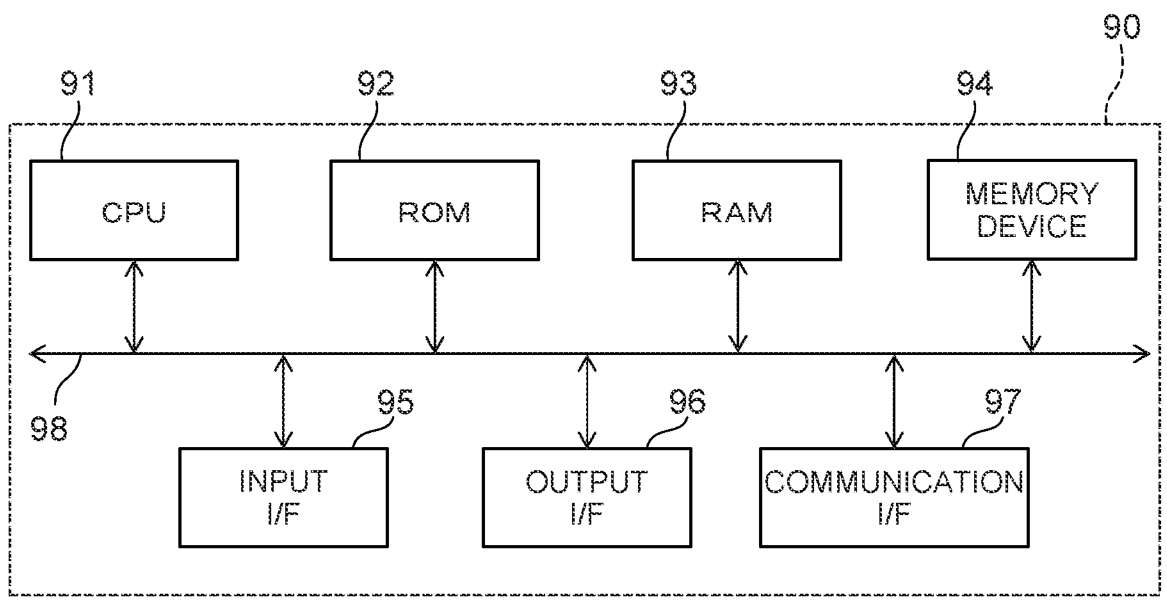
FIG. 27 is a schematic view showing a hardware configuration.

FIG. 27 is a schematic view showing a hardware configuration.

The processing circuit 90 includes, for example, the configuration shown in FIG. 27. The processing circuit 90 includes a CPU 91, ROM 92, RAM 93, a memory device 94, an input interface 95, an output interface 96, and a communication interface 97.

The ROM 92 stores programs that control the operations of the processing circuit 90. Programs that are necessary for causing the processing circuit 90 to realize the processing described above are stored in the ROM 92. The RAM 93 functions as a memory region into which the programs stored in the ROM 92 are loaded.

The CPU 91 includes a processing circuit. The CPU 91 uses the RAM 93 as work memory to execute the programs stored in at least one of the ROM 92 or the memory device 94. When executing the programs, the CPU 91 executes various processing by controlling configurations via a system bus 98.

The memory device 94 stores data necessary for executing the programs and/or data obtained by executing the programs.

The input interface (I/F) 95 connects the processing circuit 90 and an external input device. The CPU 91 can read various data from the external input device via the input I/F 95. The output interface (I/F) 96 connects the processing circuit 90 and an external output device. The CPU 91 can transmit data to the external output device via the output I/F 96. The communication interface (I/F) 97 connects the processing circuit 90 and an external server.

Fourth Embodiment

Figure 28:
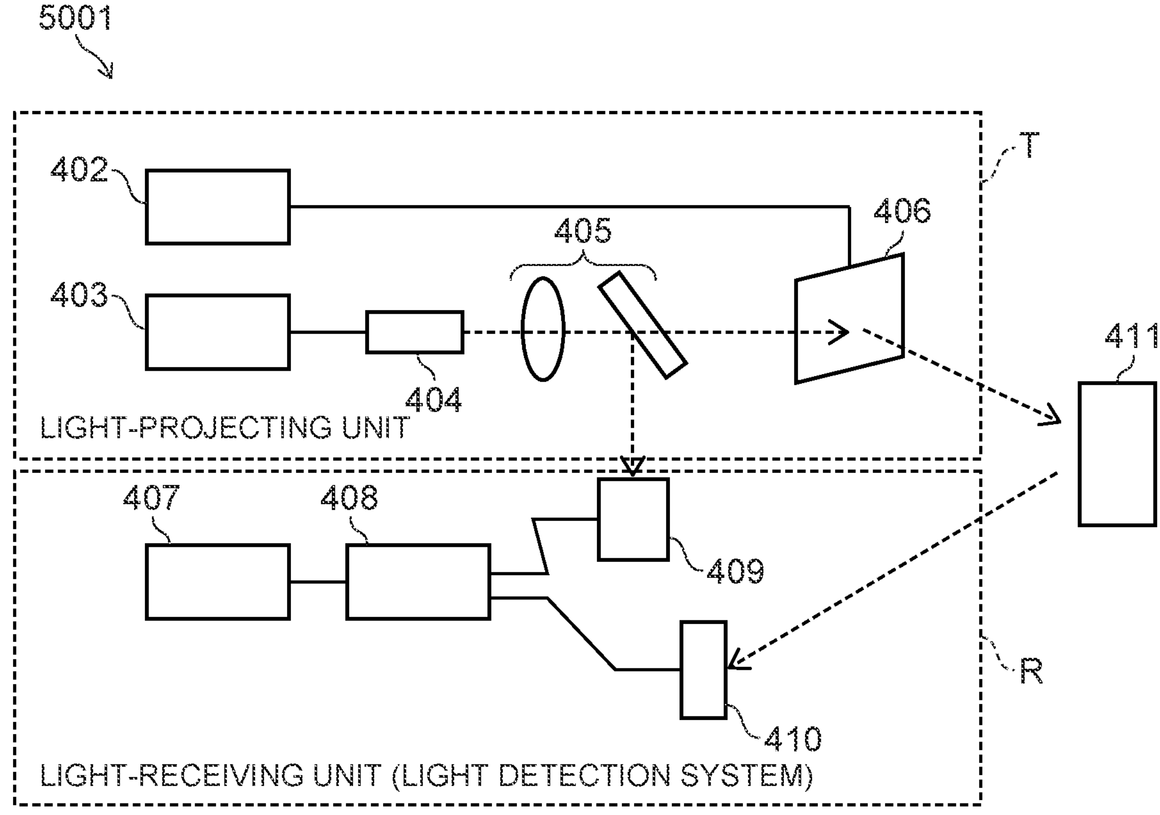
FIG. 28 is a schematic view illustrating a lidar device according to a fourth embodiment.

FIG. 28 is a schematic view illustrating a lidar (Laser Imaging Detection and Ranging (LIDAR)) device according to a fourth embodiment.

The embodiment is applicable to a long-distance subject detection system (LIDAR) or the like that includes a line light source and a lens. A lidar device 5001 includes a light-projecting unit T projecting laser light toward an object 411, and a light-receiving unit R (also called a light detection system) receiving the laser light from the object 411, measuring the time of the round trip of the laser light to and from the object 411, and converting the time into a distance.

In the light-projecting unit T, a light source 404 emits light. For example, the light source 404 includes a laser light oscillator and produces laser light. A drive circuit 403 drives the laser light oscillator. An optical system 405 extracts a portion of the laser light as reference light, and irradiates the rest of the laser light on the object 411 via a mirror 406. A mirror controller 402 projects the laser light onto the object 411 by controlling the mirror 406. Herein, "project" means to cause the light to strike.

In the light-receiving unit R, a reference light detection device 409 detects the reference light extracted by the optical system 405. A light detection device 410 receives the reflected light from the object 411. A distance measuring circuit 408 measures the distance to the object 411 based on the reference light detected by the reference light detection device 409 and the reflected light detected by the light detection device 410. An image recognition system 407 recognizes the object 411 based on the measurement results of the distance measuring circuit 408.

The lidar device 5001 employs light time-of-flight ranging (Time of Flight) in which the time of the round trip of the laser light to and from the object 411 is measured and converted into a distance. The lidar device 5001 is applicable to an automotive drive-assist system, remote sensing, etc. Good sensitivity is obtained particularly in the near-infrared region when the light detection devices of the embodiments described above are used as the light detection device 410. Therefore, the lidar device 5001 is applicable to a light source of a wavelength band that is invisible to humans. For example, the lidar device 5001 can be used for obstacle detection for a mobile body.

Figure 29:
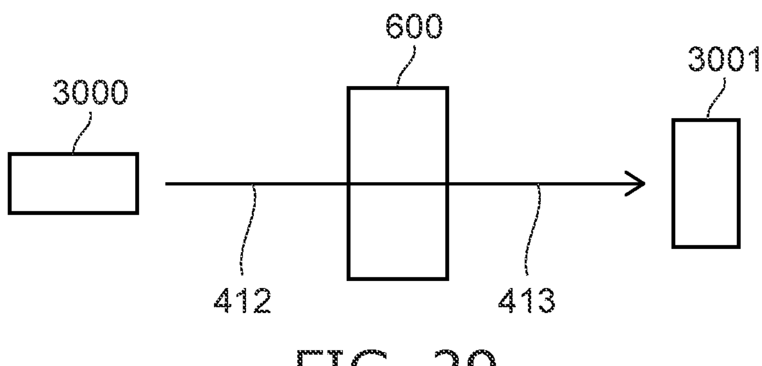
FIG. 29 describes the detection of the detection object of the lidar device.

FIG. 29 describes the detection of the detection object of the lidar device.

A light source 3000 emits light 412 toward an object 600 that is the detection object. A light detection device 3001 detects light 413 that passes through the object 600, is reflected by the object 600, or is diffused by the object 600.

For example, the light detection device 3001 can realize highly-sensitive detection when the semiconductor device according to the embodiment described above is used. It is favorable to provide multiple sets of the light detection device 410 and the light source 404 and to preset the arrangement relationship in the software (which is replaceable with a circuit). For example, it is favorable for the arrangement relationship of the sets of the light detection device 410 and the light source 404 to have uniform spacing. Thereby, an accurate three-dimensional image can be generated by the output signals of each light detection device 410 complementing each other.

Figure 30:
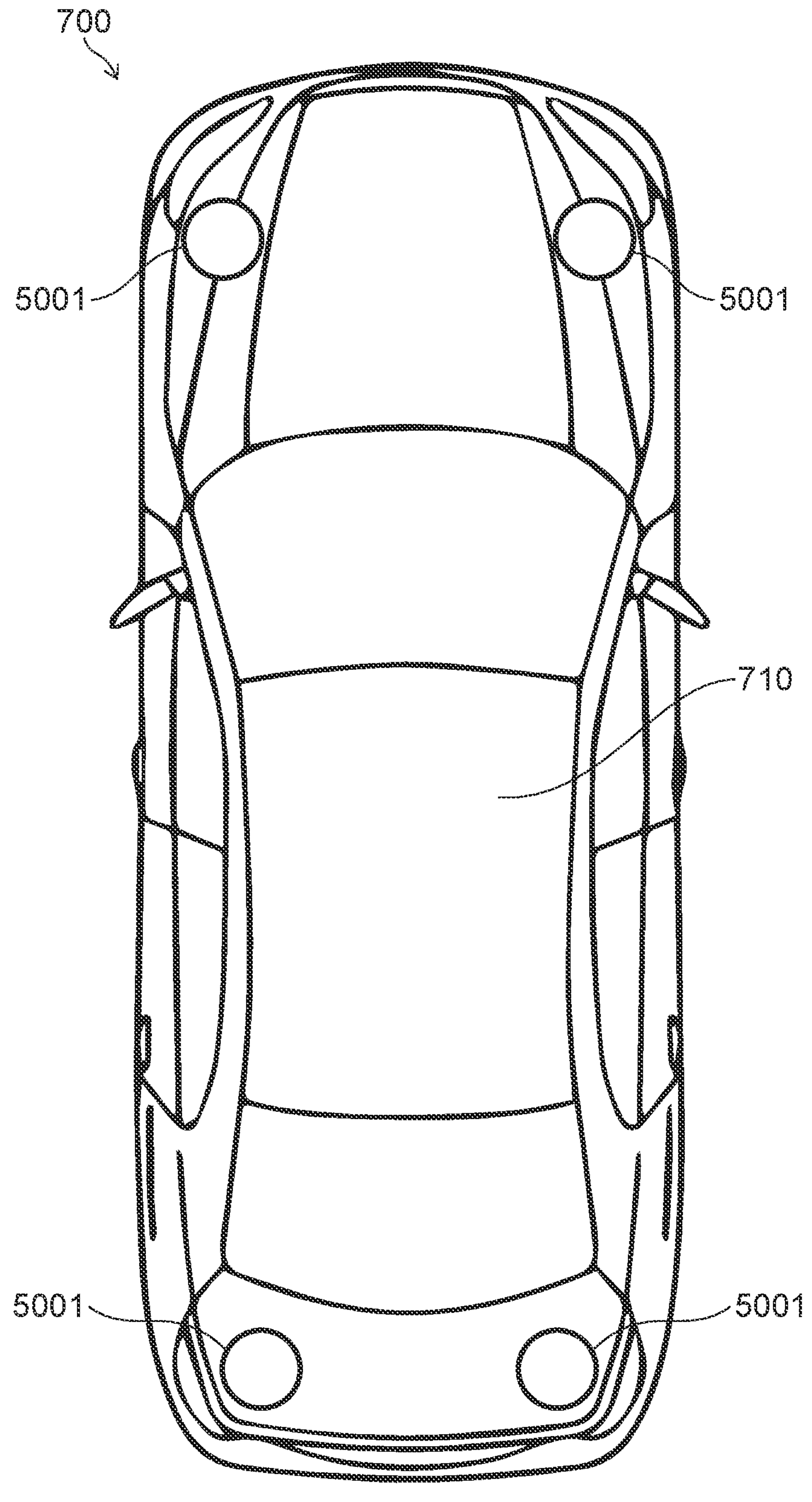
FIG. 30 is a schematic top view of a mobile body that includes the lidar device according to the fourth embodiment.

FIG. 30 is a schematic top view of a mobile body that includes the lidar device according to the fourth embodiment.

In the example of FIG. 30, the mobile body is a vehicle. A vehicle 700 according to the embodiment includes the lidar devices 5001 at four corners of a vehicle body 710. Because the vehicle according to the embodiment includes the lidar devices at the four corners of the vehicle body, the environment in all directions of the vehicle can be detected by the lidar device.

Other than the vehicle shown in FIG. 30, the mobile body may be a drone, a robot, etc. The robot is, for example, an automated guided vehicle (AGV). By including the lidar device at the four corners of such mobile bodies, the environment in all directions of the mobile body can be detected by the lidar devices.

According to the embodiments described above, a light detection device, a light detection system, a lidar device, a mobile body, an inspection method, and a method for manufacturing a semiconductor device are provided in which the inspection is easier.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in light detection devices such as semiconductor light detection elements, insulating parts, lenses, contact plugs, interconnects, insulating layers, quench portions, pad electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all light detection devices, light detection systems, lidar devices, mobile bodies, inspection methods, and methods for manufacturing semiconductor devices practicable by an appropriate design modification by one skilled in the art based on the light detection devices, the light detection systems, lidar devices, mobile bodies, inspection methods, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light detection device, comprising:

a first region including a plurality of first semiconductor light detection elements, and a plurality of first lenses respectively located on the plurality of first semiconductor light detection elements;

a second region including a plurality of second semiconductor light detection elements, no lens being located directly above the plurality of second semiconductor light detection elements at a position in a first direction of the plurality of first lenses, the first direction being from one of the plurality of first semiconductor light detection elements toward one of the plurality of first lenses;

a first electrode electrically connected with the plurality of first semiconductor light detection elements; and a second electrode electrically connected with the plurality of second semiconductor light detection elements, wherein the first electrode and the second electrode are pad electrodes and are separated from each other, the first electrode and the second electrode are configured to provide mutually different output signals independently from each other, the first electrode is configured to output a first signal corresponding to a number of the plurality of first semiconductor light detection elements, and the second electrode is configured to output a second signal corresponding to a number of the plurality of second semiconductor light detection elements.

2. The light detection device according to claim 1, further comprising:

a third region including a plurality of third semiconductor light detection elements, and a plurality of second lenses respectively located on the plurality of third semiconductor light detection elements; and a third electrode electrically connected with the plurality of third semiconductor light detection elements.

3. The light detection device according to claim 2, wherein a number of the plurality of first semiconductor light detection elements located in the first region is less than a number of the plurality of third semiconductor light detection elements located in the third region.

4. The light detection device according to claim 2, wherein a number of the plurality of first semiconductor light detection elements located in the first region is equal to a number of the plurality of second semiconductor light detection elements located in the second region.

5. The light detection device according to claim 1, further comprising:

a first semiconductor layer, the first region, the second region, the first electrode, and the second electrode being located on the first semiconductor layer.

6. The light detection device according to claim 1, wherein a resistor or a switching element is electrically connected between the first electrode and at least one of the plurality of first semiconductor light detection elements, and a resistor or a switching element is electrically connected between the second electrode and at least one of the plurality of second semiconductor light detection elements.

7. The light detection device according to claim 1, wherein the plurality of first semiconductor light detection elements and the plurality of second semiconductor light detection elements are p-i-n diodes or avalanche photodiodes.

8. The light detection device according to claim 7, wherein the plurality of first semiconductor light detection elements and the plurality of second semiconductor light detection elements are avalanche photodiodes operating in a Geiger mode.

9. A light detection system, comprising:

the light detection device according to claim 1; and a distance measuring circuit calculating a time-of-flight of light based on an output signal of the light detection device.

10. A lidar device, comprising:

a light source irradiating light on an object; and the light detection system according to claim 9 detecting light reflected by the object.

11. The lidar device according to claim 10, further comprising:

an image recognition system generating a three-dimensional image based on an arrangement relationship of the light source and the light detection device.

12. A mobile body, comprising:

the lidar device according to claim 10.

13. An inspection method, comprising:

applying a first voltage to a plurality of first semiconductor light detection elements of a light detection device, and measuring a first output value when light is irradiated via a plurality of first lenses;

applying the first voltage to a plurality of second semiconductor light detection elements of the light detection device, and measuring a second output value when light is irradiated without passing through a lens;

measuring a reference value when light is not irradiated on the plurality of first semiconductor light detection elements or the plurality of second semiconductor light detection elements to which the first voltage is applied; and inspecting the light detection device by using the first output value, the second output value, and the reference value, wherein the inspecting includes calculating a first inspection value, the first inspection value being a difference between the first output value and the reference value, and calculating a second inspection value, the second inspection value being a difference between the second output value and the reference value, and the light detection device is inspected using an increase rate of a detection efficiency of one of the plurality of first semiconductor light detection elements for the first inspection value, the second inspection value, and one of the plurality of first lenses.

14. The inspection method according to claim 13, further comprising:

measuring a first reference value when light is not irradiated on the plurality of first semiconductor light detection elements to which the first voltage is applied; and measuring a second reference value when light is not irradiated on the plurality of second semiconductor light detection elements to which the first voltage is applied, wherein the reference value includes the first reference value used to calculate the first inspection value and the second reference value used to calculate the second inspection value.

15. The inspection method according to claim 13, wherein the first voltage is greater than a breakdown voltage.

16. A method for manufacturing a semiconductor device, the method comprising:

forming a plurality of light detection devices in a semiconductor wafer; and inspecting the plurality of light detection devices by using the inspection method according to claim 13.

17. The method for manufacturing the semiconductor device according to claim 16, further comprising:

evaluating the plurality of light detection devices based on a result of the inspecting; and generating a wafer map of the evaluation of the plurality of light detection devices.

18. The method for manufacturing the semiconductor device according to claim 16, wherein the plurality of light detection devices is singulated by dicing the semiconductor wafer.

* * * * *